(12) United States Patent
Fukuda

(10) Patent No.: US 8,005,123 B2
(45) Date of Patent: Aug. 23, 2011

(54) WAVELENGTH TUNABLE LASER

(75) Inventor: Chie Fukuda, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/691,336

(22) Filed: Jan. 21, 2010

(65) Prior Publication Data

US 2010/0189143 A1    Jul. 29, 2010

(30) Foreign Application Priority Data

Jan. 26, 2009    (JP) ................................. 2009-014327

(51) Int. Cl.
*H01S 3/10*    (2006.01)

(52) U.S. Cl. .................... 372/20; 372/50.1; 372/50.121; 372/50.12; 372/99

(58) Field of Classification Search .................... 372/20, 372/50.1, 50.121, 50.12, 99
See application file for complete search history.

(56) References Cited

U.S. PATENT DOCUMENTS

| | | | |
|---|---|---|---|
| 4,896,325 A | 1/1990 | Coldren | |
| 2004/0208428 A1* | 10/2004 | Kikuchi et al. | 385/24 |
| 2005/0135449 A1* | 6/2005 | Sorin et al. | 372/50 |

* cited by examiner

*Primary Examiner* — Kinam Park

(74) *Attorney, Agent, or Firm* — Smith, Gambrell & Russell, LLP

(57) ABSTRACT

A wavelength tunable laser includes a first facet including a high reflection coating film; a gain region disposed adjacent to the first facet, the gain region including two or more light emitting devices that are arranged parallel to one another; an optical wavelength multiplexer optically connected to the light emitting devices; and an optical reflector disposed adjacent to a second facet opposite the first facet, the optical reflector having a reflection spectrum with periodic reflection peaks. The optical wavelength multiplexer is disposed between the gain region and the optical reflector, and the optical reflector and the first facet including the high reflection coating film form a laser cavity.

11 Claims, 18 Drawing Sheets

WAVELENGTH TUNABLE LASER

BACKGROUND OF THE INVENTION

1. Field of the Invention

The present invention relates to a wavelength tunable semiconductor laser.

2. Description of the Related Art

A wavelength tunable laser, which is disclosed in U.S. Pat. No. 4,896,325, for example, includes a gain region, a phase adjustment region and distributed Bragg reflectors disposed at ends of the device. The gain region and the phase adjustment region are disposed between two distributed Bragg reflectors.

SUMMARY OF THE INVENTION

In the wavelength tunable laser described in U.S. Pat. No. 4,896,325, the two distributed Bragg reflectors disposed at ends of the device have reflection spectrums that are different from each other. The distributed Bragg reflectors are made of semiconductor materials. By injecting currents into the two distributed Bragg reflectors, the reflection spectrums of the two distributed Bragg reflectors can be adjusted to desired values, whereby the emission wavelength of the laser can be tuned. However, the current control of the wavelength tunable laser is complicated and difficult for the wavelength tuning, because the current injected into each of the two distributed Bragg reflectors has to be precisely adjusted.

A wavelength tunable laser according to an embodiment of the invention includes a first facet including a high reflection coating film; a gain region disposed adjacent to the first facet, the gain region including two or more light emitting devices that are arranged parallel to one another; an optical wavelength multiplexer optically connected to the light emitting devices; and an optical reflector disposed adjacent to a second facet opposite the first facet, the optical reflector having a reflection spectrum with periodic reflection peaks. The optical wavelength multiplexer is disposed between the gain region and the optical reflector. The optical reflector and the first facet having the high reflection coating film form a laser cavity.

In the wavelength tunable laser, light is generated by injecting a current into a light emitting device of the gain region. The light emitting device is optically connected to the optical wavelength multiplexer. The light emitted from the light emitting device is transmitted through the optical wavelength multiplexer and has a predetermined wavelength. The light passing through the optical wavelength multiplexer is selectively reflected by the optical reflector. The light reflected by the optical reflector is again amplified by the light emitting device, and reflected by the first facet including the high reflection coating film. Thus, laser oscillation can be obtained when the light, which is generated by the light emitting device into which a current has been selectively injected, is repeatedly subjected to feedback and amplification between the optical reflector and the first facet including the high reflection coating film. At this time, the optical reflector and the first facet having the high reflection coating film form a laser cavity. With this structure, a laser light having a desired wavelength can be stably output. The reflection wavelengths of the optical reflector having the reflection spectrum with the periodic reflection peaks can be changed by injecting a current into the optical reflector. As a result, the wavelength tunable laser facilitates current control. The optical wavelength multiplexer combines light and selectively transmits light in a predetermined wavelength band. Thus, the optical wavelength multiplexer separates a specific wavelength band (segment) from the wavelength range of the light generated by the light emitting device. The first facet including the high reflection coating film reflects light and performs feedback on the light.

The optical reflector having the reflection spectrum with the periodic reflection peaks includes a ring resonator and the second facet. The ring resonator has narrow periodic transmission bands with a transmission peak in each transmission band. Thus, the ring resonator functions as a periodic filter that transmits light having specific wavelengths. Only the light having the specific wavelengths transmitted by the ring resonator is reflected by the second facet, which functions as a mirror. It is preferable that the second facet is a cleaved facet. As a result, the ring resonator and the second facet form an optical reflector having the reflection spectrum with the periodic reflection peaks. In this case, the optical transmittance of the ring resonator can be changed at a predetermined wavelength interval by injecting a current into the ring resonator, which is suitable for the wavelength tunable laser of the present invention.

The second facet has an anti-reflective coating thereon. In this case, the reflectivity of the second facet serving as an optical output facet can be adjusted by providing the reflection coating film, so that a laser light can be efficiently emitted.

The optical reflector having the reflection spectrum with the periodic reflection peaks may include an optical device including a super structure grating. Because the optical device including the super structure grating has the spectrum with the periodic reflection peaks, the optical device super structure grating is suitable for an optical reflector for reflecting the light transmitting from the optical wavelength multiplexer. By controlling the amount of current injected into the optical device, the wavelength of laser oscillation can be tuned.

It is preferable that the optical wavelength multiplexer includes a Mach-Zehnder interferometer. The Mach-Zehnder interferometer, for example, includes two input ports, two output ports, and two optical waveguides coupled to the input ports and the output ports. The two waveguides of the Mach-Zehnder interferometer have optical path lengths that are different from each other. The Mach-Zehnder interferometer functions as a wavelength selective filter with respect to the input light. Therefore, the Mach-Zehnder interferometer in the optical wavelength multiplexer facilitates the functions of guiding light generated by the light emitting device of the gain region, selectively transmitting light in a predetermined wavelength band, and separating it to the light with the predetermined wavelength band (segment).

It is preferable that the optical wavelength multiplexer includes first and second Mach-Zehnder interferometer groups connected in a cascade manner. A transmission wavelength band of the optical wavelength multiplexer can be easily adjusted to be, for example, narrower to separate the broad-band light from the light emitting device to the narrow-band light with a predetermined wavelength band (segment).

In the wavelength tunable laser of the present invention, the gain region, the optical wavelength multiplexer, and the optical reflector may be formed on a single semiconductor substrate, and the optical wavelength multiplexer and the gain region may be optically coupled to each other by butt joint coupling. By integrating these optical components on a single semiconductor substrate, the size of the device can be made smaller. By making the optical components from semiconductor materials, an emission wavelength can be easily changed by current injection. By butt joint coupling the optical waveguides of the optical wavelength multiplexer and the gain region to each other, the efficiency of the optical coupling can be increased, whereby an efficient and high-power wavelength tunable laser can be obtained.

It is preferable that the optical wavelength multiplexer has a transmission wavelength range narrower than a emission wavelength range of the light from the light emitting device. The optical wavelength multiplexer separates the light from the light emitting device to the light with the predetermined wavelength band (segment).

It is preferable that at least one of the periodic reflection peaks in the reflection spectrum of the optical reflector exists within the transmission wavelength range of the optical wavelength multiplexer. Thus, laser oscillation can be obtained at a predetermined wavelength.

The wavelength tunable laser may further include a first group of upper electrodes disposed on the light emitting devices, and a second group of upper electrodes disposed on the optical reflector having the reflection spectrum with the periodic reflection peaks. An optical gain may be generated by injecting a current into one of the two or more light emitting devices through the first group of upper electrodes disposed on the light emitting devices. A reflection wavelength may be changed by injecting a current into the optical reflector having the reflection spectrum with the periodic reflection peaks through the second group of upper electrodes disposed on the optical reflector. Thus, the oscillation wavelength of the laser can be tuned within a desired wavelength range by the current injected into the optical reflector.

The wavelength tunable laser may further include a gain control circuit electrically connected to the light emitting devices to control a current injected into the light emitting devices, and a wavelength control circuit electrically connected to the optical reflector having the reflection spectrum with the periodic reflection peaks to control a current injected into the optical reflector.

The above-described object, other objects, characteristics, and advantages of the present invention will be more easily understood from the following detailed description of the preferred embodiments of the present invention with reference to the attached drawings.

DESCRIPTION OF THE PREFERRED EMBODIMENTS

Figure 1:
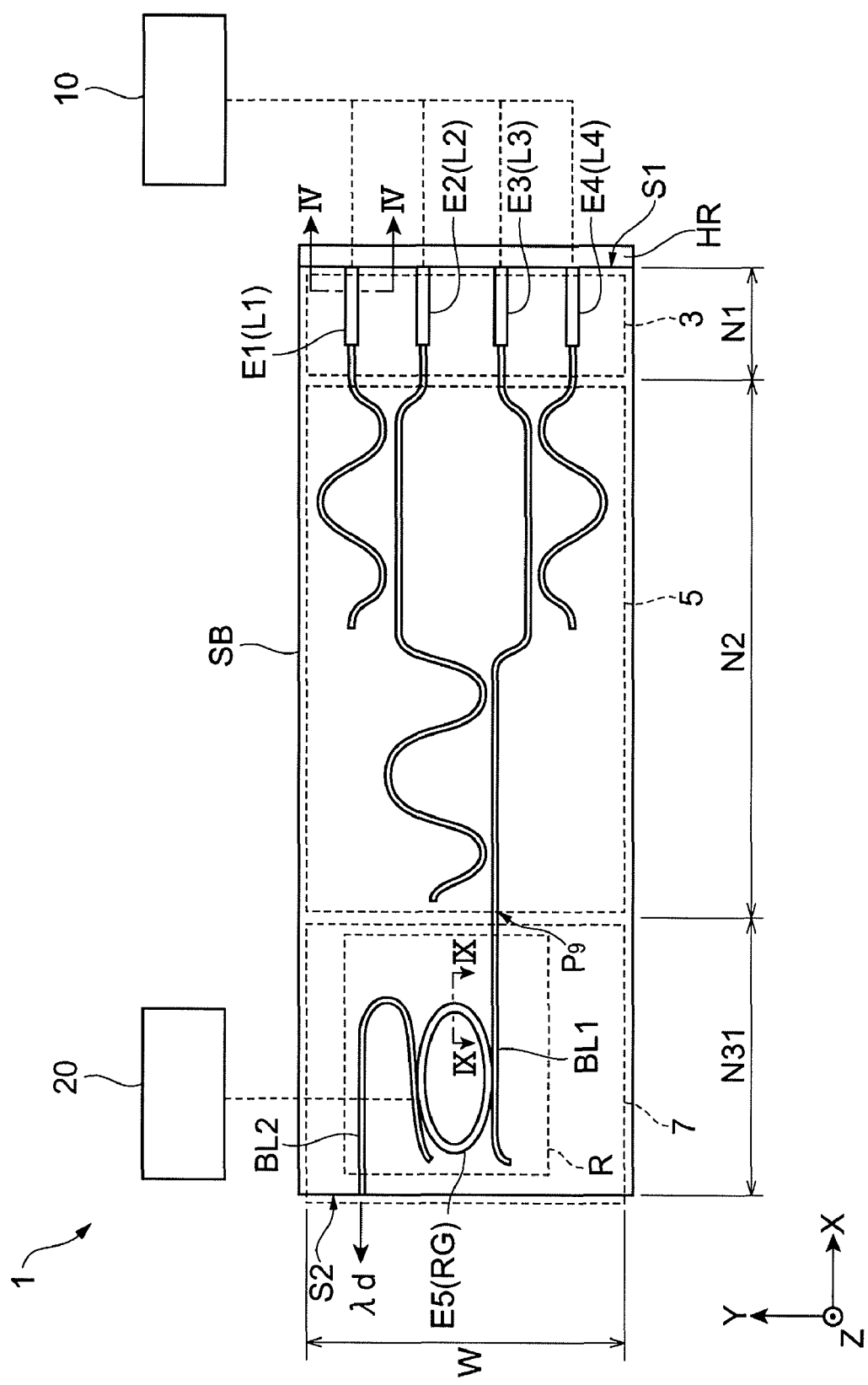
FIG. 1 is a schematic view showing a wavelength tunable laser according to a first embodiment.

Hereinafter, embodiments of the present invention will be described in detail with reference to the attached drawings. The same numerals denote the same elements in the drawings, and redundant description is omitted.

First Embodiment

FIG. 1 is a schematic view showing a wavelength tunable laser according to a first embodiment. A wavelength tunable laser 1 includes a high reflection coating film HR disposed on a first facet S1, a gain region 3 disposed on a substrate SB and adjacent to the first facet S1, an optical wavelength multiplexer 5 for combining light generated in the gain region 3, and an optical reflector 7 disposed adjacent to a second facet S2 opposite the first facet S1. The gain region 3 includes two or more light emitting devices (L1 to L4) that are arranged parallel to one another. The light emitting devices generate light when currents are injected thereinto. The reflection spectrum of the optical reflector 7 has periodic reflection peaks. The optical wavelength multiplexer 5 is disposed between the gain region 3 and the optical reflector 7. The optical reflector 7 is constituted by a ring resonator R and the second facet S2. The second facet S2 reflects light that has passed through the ring resonator R as a reflection mirror. The ring resonator R has a periodic transmission spectrum and functions as a very narrow band-pass filter having periodic pass band.

The size of the wavelength tunable laser 1 with respect to the XYZ orthogonal coordinate system of FIG. 1 is, for example, as follows. The length N1 of the gain region 3 in the direction of the optical axis of the wavelength tunable laser 1 (the direction of the X axis) is, for example, 570 μm. The length N2 of the optical wavelength multiplexer 5 is, for example, 580 μm. The length N31 of the optical reflector 7 is, for example, 200 μm. Therefore, the entire length of the wavelength tunable laser 1 in the direction of the optical axis is, for example, about 1350 μm. The width W of the wavelength tunable laser 1 in the direction perpendicular to the optical axis (the direction of the Y axis) is, for example, about 250 μm.

The high reflection coating film HR will be described below. The high reflection coating film HR of the optical reflector 7 is disposed on the second facet S2. The second facet S2 of the optical reflector 7 may be formed by cleaving. A reflection coating film may be formed on the cleaved facet S2 so as to adjust the reflectivity. The high reflection coating film HR has a reflectivity of, for example, 70% or higher, and reflects light emitted from the light emitting devices (L1 to L4) as a high reflection mirror. The reflectivity of the high reflection coating film HR is almost constant in the wavelength range of the emission spectrum of the light emitting devices.

Figure 2:
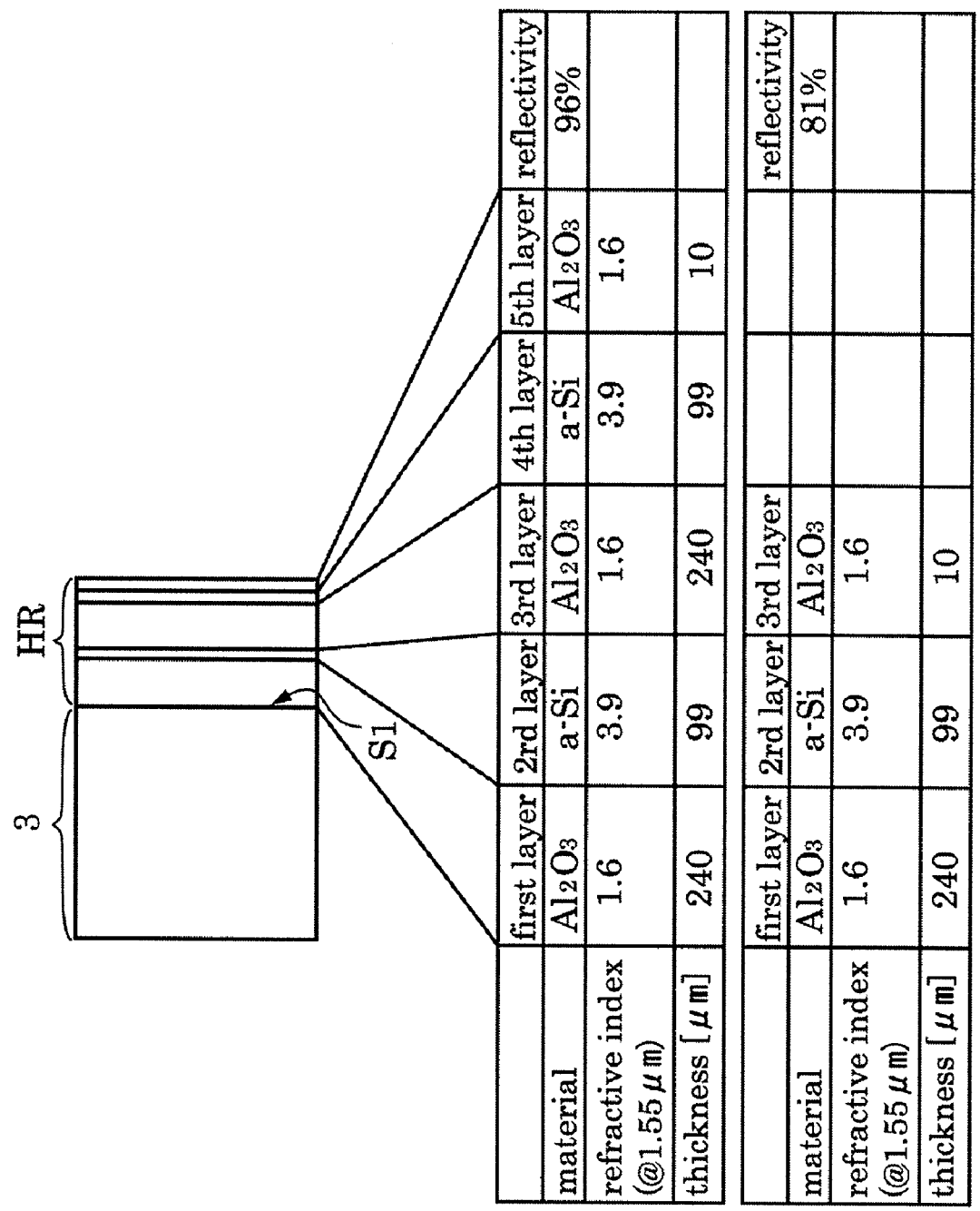
FIG. 2 is a schematic view of a high reflection coating film.

FIG. 2 is a schematic view of an example of the high reflection coating film HR disposed on the first facet S1. As illustrated in FIG. 2, the high reflection coating film HR has a multi-layer structure. The multi-layer structure may include, for example, three layers or five layers. In general, the larger the number of layers in a multi-layer structure is, the higher the reflectivity of a high reflection coating film becomes. By increasing the reflectivity of the high reflection coating film HR, the output power of light emitted from the second facet S2 can be increased. By adjusting the reflectivity of the high reflection coating film HR to a predetermined value, the light to be used for wavelength monitoring or power monitoring is obtained from the first facet S1.

The high reflection coating film HR includes, for example, a dielectric multilayer in which aluminum oxide $Al_2O_3$ layers and amorphous silicon (a-Si) layers are alternately stacked. FIG. 2 illustrates practical examples of the dielectric material, the refractive index, and the thickness of the high reflection coating film HR that is used for light in a 1.55 μm wavelength band.

Figure 3:
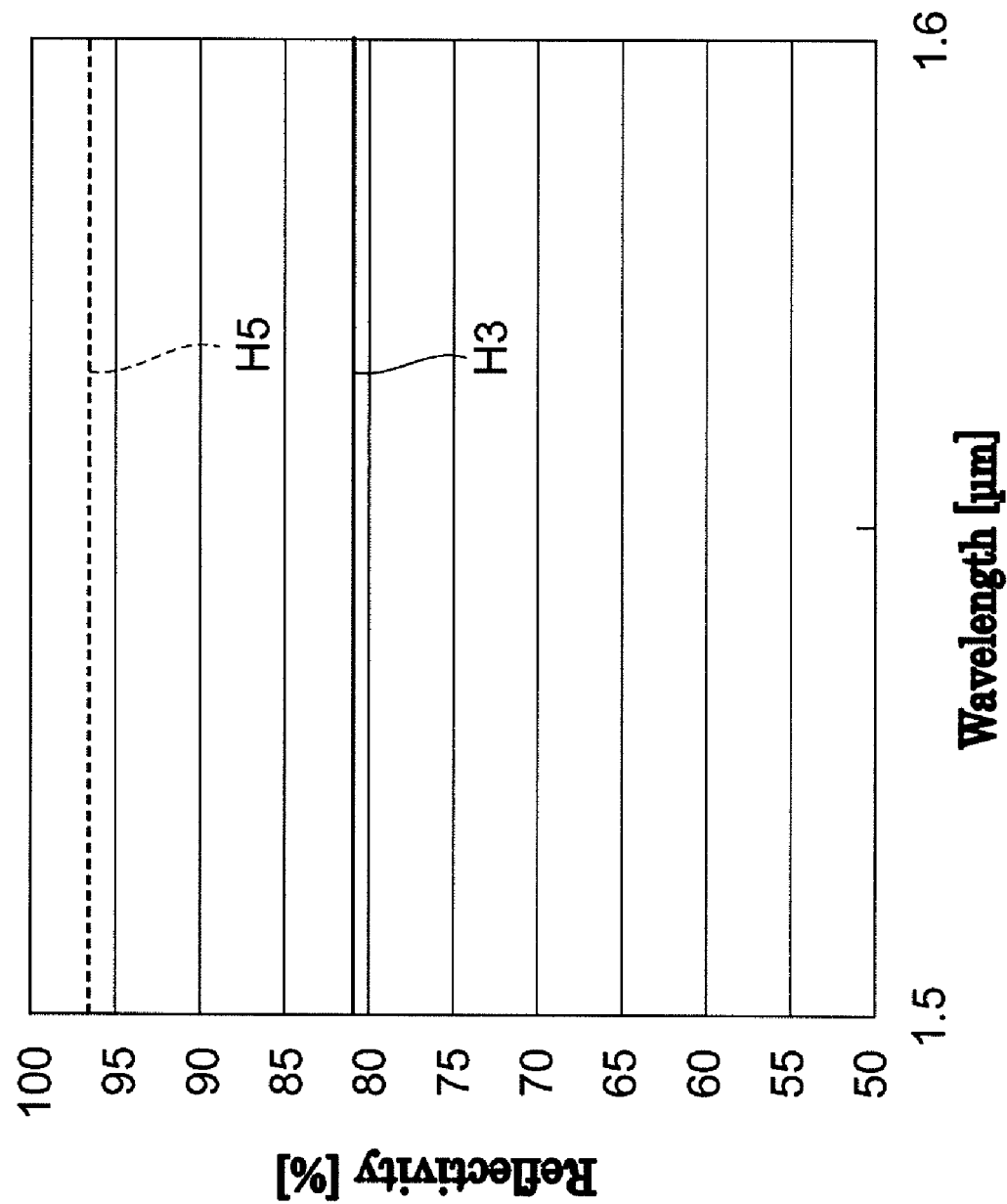
FIG. 3 is a graph showing a reflection spectrum of the high reflection coating film.

For the wavelength range of 1.5 μm to 1.6 μm, the high reflection coating film HR has a reflectivity in the range of 75% to 98%. FIG. 3 illustrates the wavelength dependence of the reflectivity of the high reflection coating film HR. In FIG. 3, the dotted line H5 represents the reflectivity of the high reflection coating film HR constituted by five layers in which $Al_2O_3$ and a-Si are alternately stacked. In FIG. 3, the solid line H3 represents the reflectivity of the high reflection coating film HR constituted by three layers in which $Al_2O_3$ and a-Si are alternately stacked. As illustrated in FIGS. 2 and 3, the reflectivity of the high reflection coating film HR constituted by the five layers is 96%, and the reflectivity of the high reflection coating film HR constituted by the three layers is 81%. The high reflection coating film HR can be formed, for example, by electron cyclotron resonance (ECR) sputtering method.

Next, the gain region 3 will be described. As illustrated in FIG. 1, the longitudinal direction of the light emitting devices L1 to L4 is the same as the direction of the X axis. The light emitting devices L1 to L4 are arranged at a predetermined interval in the direction of the Y axis. All the light emitting devices L1 to L4 of the gain region 3 are manufactured in accordance with the same design and have substantially the same characteristics.

The light emitting devices L1 to L4 of the gain region 3 respectively include a first group of upper electrodes E1 to E4 and lower electrodes (not shown). A gain control circuit 10 is electrically connected to the first group of upper electrodes E1 to E4 and the lower electrodes. The gain control circuit 10 controls the amount of current injected into the light emitting devices L1 to L4, and performs on-off control of the current injection into the light emitting devices L1 to L4.

Figure 4:
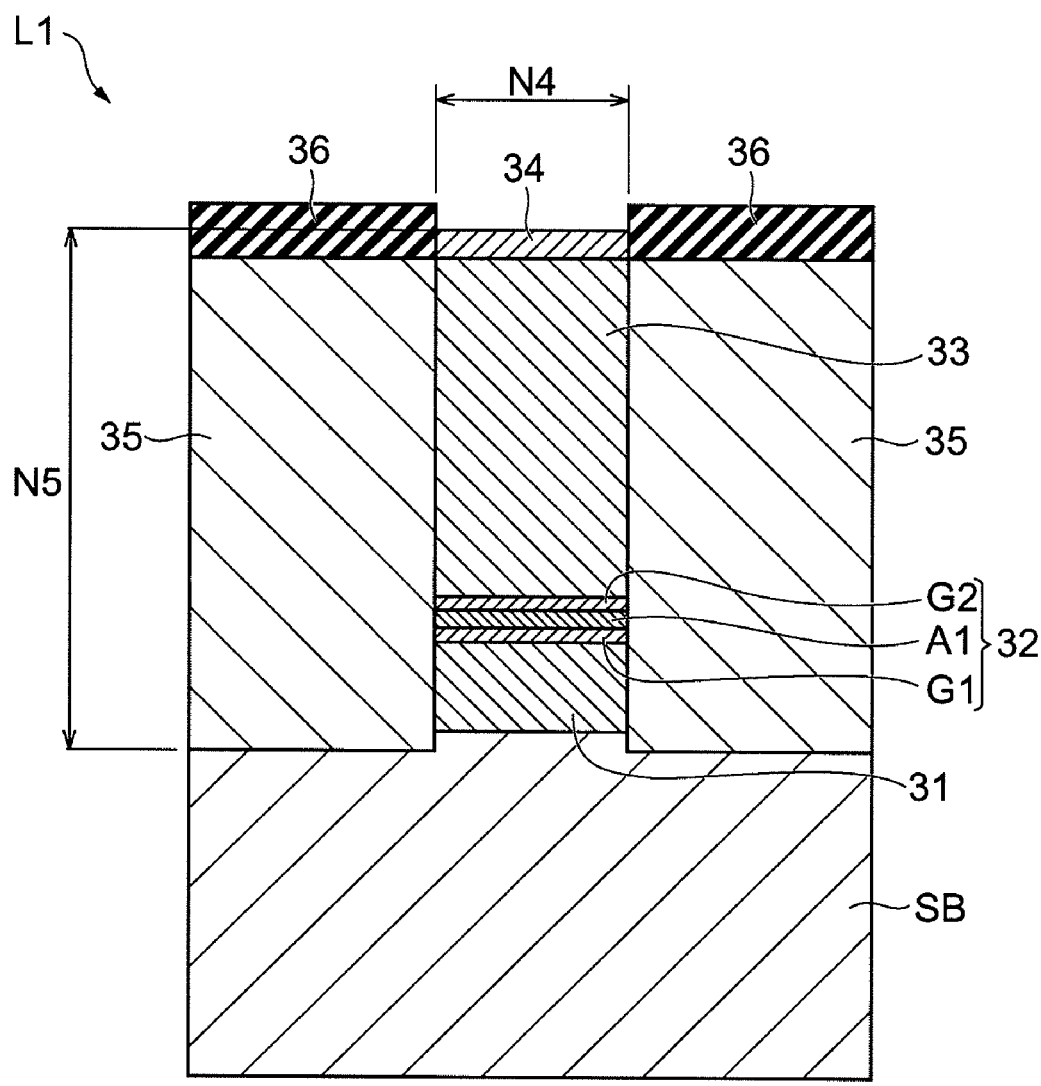
FIG. 4 is a cross-sectional view of a light emitting device taken along line IV-IV of FIG. 1.

FIG. 4 is a cross-sectional view of the light emitting device L1 taken along line IV-IV of FIG. 1. Description of the light emitting devices L2 to L4, which have structures similar to that of the light emitting device L1, is omitted. As illustrated in FIG. 4, the light emitting device L1 includes the following layers stacked on the substrate SB in the following order: a lower cladding layer 31; an optical waveguide layer 32 including a lower light guide layer G1, an active layer A1, and an upper light guide layer G2; an upper cladding layer 33; and a contact layer 34. The lower cladding layer 31, the optical waveguide layer 32, and the upper cladding layer 33 constitute a mesa structure. Current blocking layers 35 are formed at the both sides of mesa structure and on the substrate SB. Insulating layers 36 are formed on the current blocking layers 35.

For example, when an n-type InP substrate is used as the substrate SB, the light emitting device L1 may have the following structure. That is, the light emitting device L1 may include the following layers: the lower cladding layer 31 made of n-type InP; the optical waveguide layer 32 including the active layer A1 that is a strained multi quantum well layer (MQW layer) made of GaInAsP, and the lower and upper light guide layers G1 and G2 that are separate confinement heterostructure (SCH) layers; the upper cladding layer 33 made of p-type InP; the contact layer 34 made of p-type GaInAs; the current blocking layers 35 made of Fe-doped semi-insulating InP; and the insulating layers 36 made of $SiO_2$.

The width N4 of the mesa structure constituted by the lower cladding layer 31, the optical waveguide layer 32, and the upper cladding layer 33 in the direction of the Y axis is, for example, 1.8 μm. The height N5 of the mesa structure in the direction of the Z axis is, for example, 4 μm.

Although not illustrated in FIG. 4, the upper electrodes E1 to E4 are disposed on the contact layers 34 of the light emitting devices L1 to L4, respectively. On portions of the lower surface of the substrates SB corresponding to the light emitting devices L1 to L4, the lower electrodes are disposed. Through the electrodes, currents can be injected into the light emitting devices L1 to L4 of the gain region 3. Optical gain and light emission can be generated in a predetermined wavelength range, which depends on the semiconductor material and structure of the active layer A1.

Figure 5:
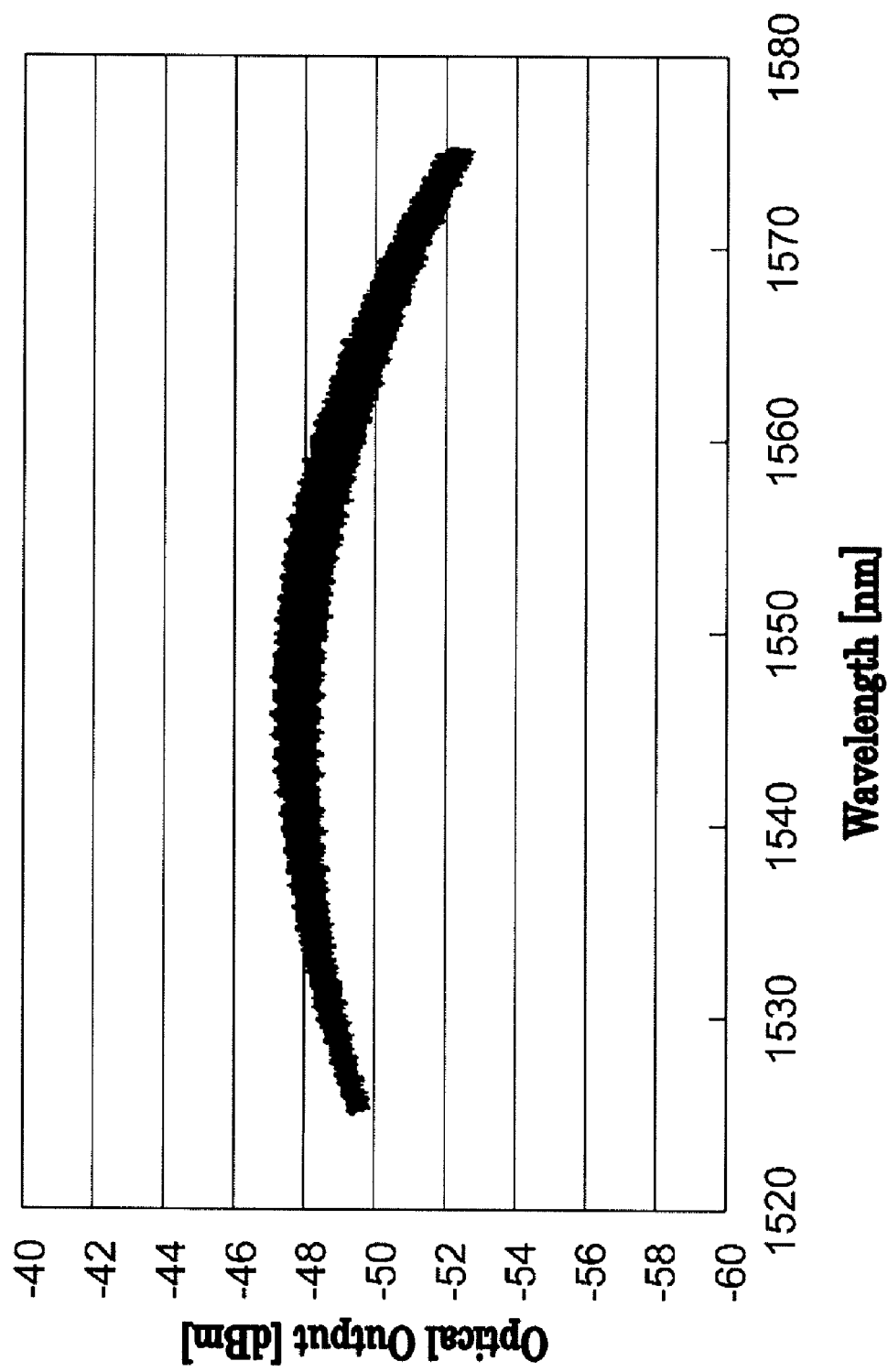
FIG. 5 is a graph showing an example of an emission spectrum of the light emitting device in the gain region at 25° C.

FIG. 5 illustrates an example of the emission spectrum of the optical devices L1 to L4 of the gain region 3 at the temperature of 25° C. The light emitting devices L1 to L4 of the gain region 3 emit light in a broad wavelength range of 1525 nm to 1575 nm and have gains approximately within this wavelength range. The center wavelength of the emission spectrum is about 1550 nm.

Figure 6:
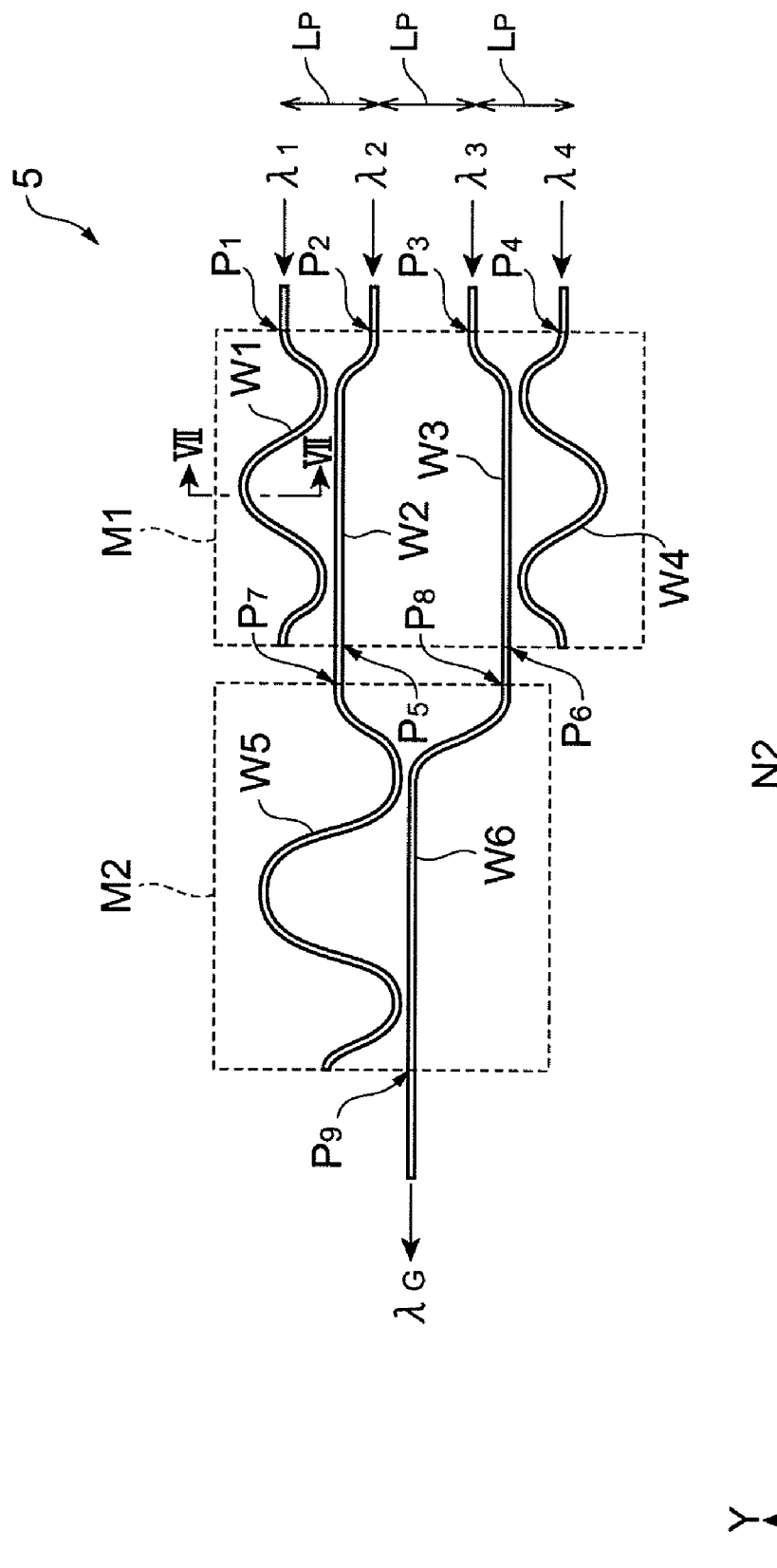
FIG. 6 is an enlarged schematic view of an optical wavelength multiplexer illustrated in FIG. 1.

Next, the optical wavelength multiplexer 5 will be described. The optical wavelength multiplexer 5 can multiplex light generated by the light emitting devices of the gain region 3. FIG. 6 is an enlarged schematic view of the optical wavelength multiplexer 5 illustrated in FIG. 1. As illustrated in FIG. 6, the optical wavelength multiplexer 5 includes a first Mach-Zehnder interferometer group M1 and a second Mach-Zehnder interferometer group M2. The first Mach-Zehnder interferometer group M1 and the second Mach-Zehnder interferometer group M2 are connected in a cascade manner.

The first Mach-Zehnder interferometer group M1, for example, includes two Mach-Zehnder interferometers. Thus, the first Mach-Zehnder interferometer group M1 includes a first arm W1, a second arm W2, a third arm W3, and a fourth arm W4. The first arm W1 is optically coupled to a port $P_1$ to which light emitted from the light emitting device L1 will enter. The second arm W2 is optically coupled to a port $P_2$ to which light emitted from the light emitting device L2 will enter. The third arm W3 is optically coupled to a port $P_3$ to which light emitted from the light emitting device L3 will enter. The fourth arm W4 is optically coupled to a port $P_4$ to which light emitted from the light emitting device L4 will enter. The first Mach-Zehnder interferometer group M1 further includes a port $P_5$ and a port $P_6$. Light that has passed through the first arm W1 and the second arm W2 is output from the port $P_5$. Light that has passed through the third arm W3 and the fourth arm W4 is output from the port $P_6$.

The second Mach-Zehnder interferometer group M2, for example, includes a single Mach-Zehnder interferometer. Thus, the second Mach-Zehnder interferometer group M2 includes a port $P_7$, a port $P_8$, a fifth arm W5, a sixth arm W6, and a port $P_9$. The port $P_7$ is optically coupled to the port $P_5$ of the first Mach-Zehnder interferometer group M1. The port $P_8$ is optically coupled to the port $P_6$ of the first Mach-Zehnder interferometer group M1. The fifth arm W5 is optically coupled to the port $P_7$. The sixth arm W6 is optically coupled to the port $P_8$. Light that has passed through the fifth arm W5 and the sixth arm W6 is output from the port $P_9$.

As illustrated in FIG. 6, the first arm W1 and the second arm W2 have a predetermined difference in length of, for example, 32.51 μm. Thus, the first arm W1 and the second arm W2 can be provided with a predetermined optical path length difference. The third arm W3 and the fourth arm W4 have a predetermined difference in length of, for example, 32.40 μm. Thus, the third arm W3 and the fourth arm W4 can be provided with a predetermined optical path length difference. The ports $P_1$ to $P_4$ are arranged in the direction of the Y axis with a predetermined interval Lp therebetween. The length of the interval Lp is, for example, 20 μm.

Figure 7:
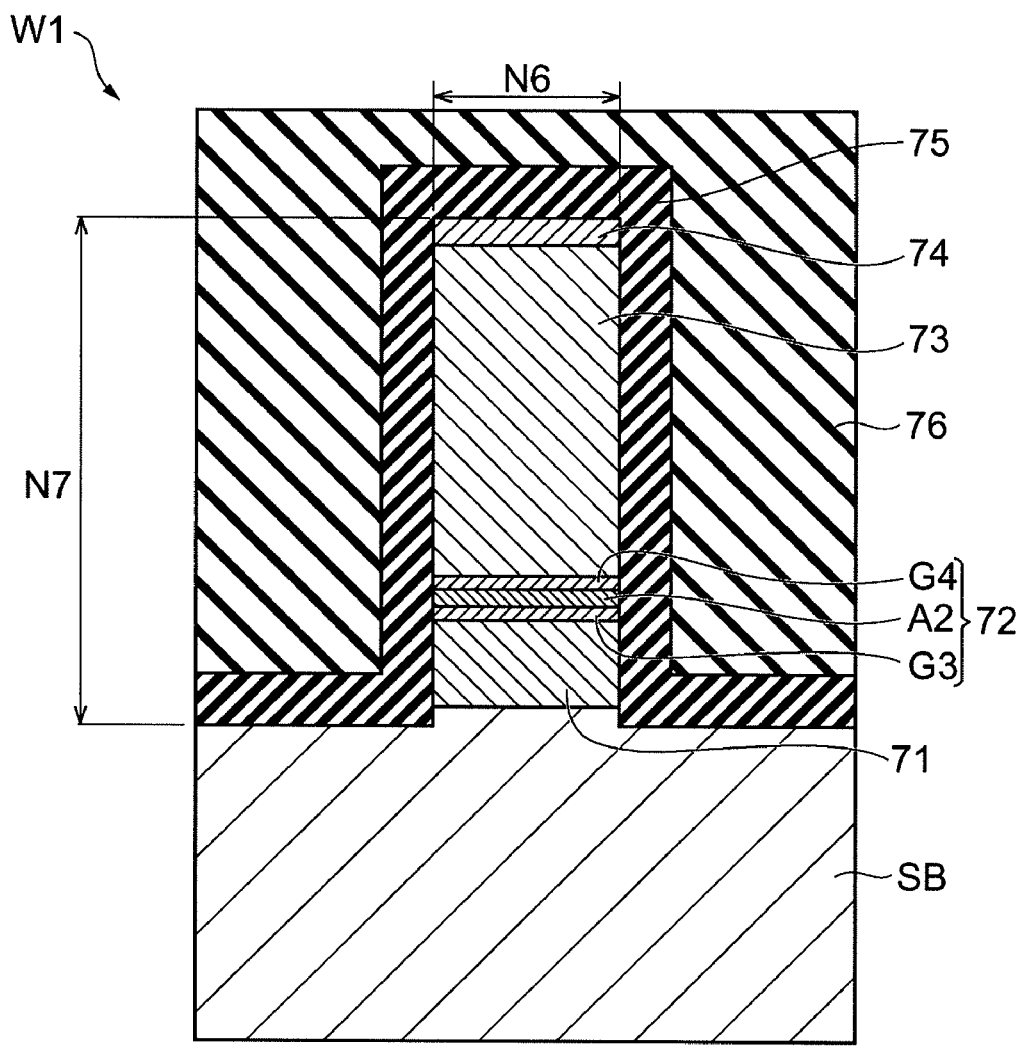
FIG. 7 is a cross-sectional view of a first arm W1 of a first Mach-Zehnder interferometer group of the optical wavelength multiplexer taken along line VII-VII of FIG. 6.

FIG. 7 is a cross-sectional view of the first arm W1 taken along line VII-VII of FIG. 6. Description of the second to sixth arms W2 to W6, which have structures similar to that of the first arm W1, is omitted. As illustrated in FIG. 7, the first arm W1 of the optical wavelength multiplexer 5 includes the following layers stacked on the substrate SB in the following order: a lower cladding layer 71; an optical waveguide layer 72 including a lower light guide layer G3, a center light guide layer A2, and an upper light guide layer G4; an upper cladding layer 73; and a contact layer 74. The lower cladding layer 71, the optical waveguide layer 72, the upper cladding layer 73, and the contact layer 74 constitute a mesa structure. An insulating layer 75 is formed on the side and top of the mesa structure and on the substrate SB so as to cover the mesa structure. A polymer layer 76 is formed on the insulating layer 75.

For example, when an n-type InP substrate is used as the substrate SB, the first arm W1 may have the following structure. That is, the first arm W1 may include the following layers: the lower cladding layer 71 made of n-type InP; the optical waveguide layer 72 including the center light guide layer A2 made of GaInAsP and having a bandgap wavelength of 1.4 μm, and the lower and upper light guide layers G3 and G4 that are separate confinement heterostructure (SCH) layers having a bandgap wavelength of 1.2 μm; the upper cladding layer 73 made of p-type InP; the contact layer 74 made of p-type GaInAs; the insulating layer 75 made of $SiO_2$; and the polymer layer 76 made of bisbenzocyclobutene (BCB).

The thicknesses of these semiconductor layers that constitute the optical wavelength multiplexer 5 can be designed so that the arms of the wavelength multiplexer 5 can be a single mode optical waveguide with respect to, for example, light having a wavelength of 1.52 μm. As will be described below, these semiconductor layers can be formed by, for example, metal-organic vapor phase epitaxy (MOVPE) method and dry etching process.

The width N6 of the mesa structure constituted by the lower cladding layer 71, the optical waveguide layer 72, the upper cladding layer 73, and the contact layer 74 in the direction of the Y axis is, for example, 1.3 μm. The height N7 of the mesa structure in the direction of the Z axis is, for example, 4 μm.

If the mode field size and shape between the optical waveguides of the gain region 3 and the optical wavelength multiplexer 5 are different from each other, a tapered optical waveguide for mode conversion may be provided between the gain region 3 and the optical wavelength multiplexer 5. In this case, optical coupling loss at the junction between the gain region 3 and the optical wavelength multiplexer 5 can be suppressed.

As described above, the optical wavelength multiplexer 5 includes the Mach-Zehnder interferometers. With the Mach-Zehnder interferometers, the optical wavelength multiplexer 5 can function not only as an optical coupler but also as a band-pass filter having a predetermined wavelength band. For example, by appropriately designing the optical path length difference between two optical waveguides of each of the Mach-Zehnder interferometers, the transmission wavelength band of the Mach-Zehnder interferometers or the transmission wavelength band of the optical wavelength multiplexer 5 can be adjusted. After passing the optical wavelength multiplexer 5, a light having a predetermined wavelength band is selectively filtered from the broad-band emission light generated in the gain region. Furthermore, the first Mach-Zehnder interferometer group M1 and the second Mach-Zehnder interferometer group M2 are connected in a cascade manner. A transmission wavelength band of the optical wavelength multiplexer can be easily adjusted to be, for example, narrower to separate the broad-band light from the light emitting device to the narrow-band light with a predetermined wavelength band (segment) as shown in FIG. 8.

Figure 8:
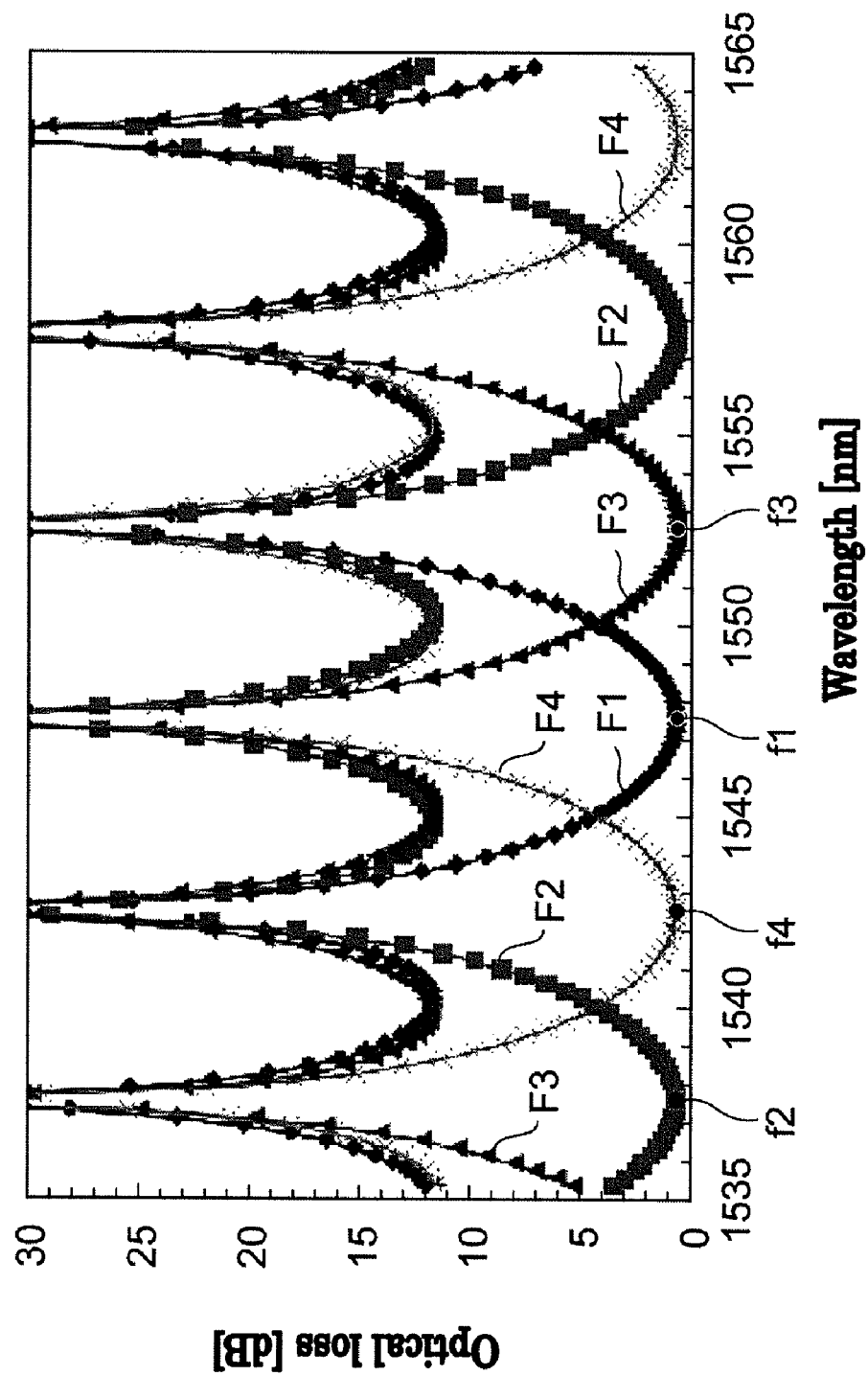
FIG. 8 is a graph showing an example of a transmission spectrum of the optical wavelength multiplexer.

FIG. 8 is a graph illustrating an example of the transmission spectrum of the optical wavelength multiplexer 5. In FIG. 8, curves F1, F2, F3, and F4 respectively represent the relationships between the optical loss and the wavelength of light that is propagated from the ports $P_1$, $P_2$, $P_3$, and $P_4$ to the port P9 of the optical wavelength multiplexer 5 illustrated in FIG. 6.

As illustrated in FIG. 8, the optical wavelength multiplexer 5 has transmission bands in which the optical loss is very low in a wavelength range of 1500 nm to 1600 nm. The interval between the wavelengths at which the optical loss has a minimum value is in the range of 5.1 nm to 5.2 nm. That is, in FIG. 8, the interval between the minimum value f2 of the curve F2 and the minimum value f4 of the curve F4 adjacent to the curve F2 is in the range of 5.1 nm to 5.2 nm. Likewise, the interval between the minimum value f4 of the curve F4 and the minimum value f1 of the curve F1 adjacent to the curve F4 is in the range of 5.1 nm to 5.2 nm, and the interval between the minimum value f1 of the curve F1 and the minimum value f3 of the curve F3 adjacent to the curve F1 is in the range of 5.1 nm to 5.2 nm.

As illustrated in FIGS. 5 and 8, it is desirable that the wavelength range of light generated in the gain region 3 (for example, 1525 nm to 1575 nm) be larger than the transmission wavelength range of any one of the ports of the optical wavelength multiplexer 5 (for example, 1545 nm to 1550 nm for the port $P_1$). In this case, the optical wavelength multiplexer can easily combine the lights generated in the gain region and selectively output a light having a predetermined and narrow wavelength band.

Next, an optical reflector having a reflection spectrum with periodic reflection peaks will be described. As illustrated in FIG. 1, the optical reflector 7 is constituted by a ring resonator R and the second facet S2. The ring resonator R functions as a periodic filter having periodic transmission bands. The second facet S2 functions as a reflection mirror that reflects light passing through the ring resonator R. The second facet S2 may be a cleaved facet of the device, or may further include a reflection coating film formed on the cleaved facet so as to adjust the reflectivity. The wavelength dependence of the reflectivity of the second facet S2 is lower than the wavelength dependence of the transmission spectrum of the ring resonator. Therefore, the reflection spectrum of the optical reflector 7 is approximately the same as the transmission spectrum of the ring resonator. The ring resonator R includes a waveguide BL1, a ring waveguide RG having an annular shape, a waveguide BL2, a second group of an upper electrode E5, and a lower electrode (not shown). The waveguide BL1 is optically coupled to the port $P_9$ of the optical wavelength multiplexer 5. The ring waveguide RG is optically coupled to the waveguide BL1 using a multimode interference (MMI) coupler. The waveguide BL2 is optically coupled to the ring waveguide RG using a MMI coupler. The upper electrode E5 has an annular shape, and is disposed on a contact layer (described below) of the ring waveguide RG. The lower electrode is disposed on the lower surface of the substrate SB. The upper electrode E5 contacts a portion (arc-shaped portion) excluding a multimode interference (MMI) coupler. The upper electrode E5 and the lower electrode are electrically connected to a wavelength control circuit 20. The wavelength control circuit 20 controls the amount of current injected into the ring resonator R. By controlling the amount of current injected into the ring resonator R, the transmission wavelength of the ring resonator can be changed, and hence the reflection wavelength of the optical reflector 7 can be changed.

Figure 9:
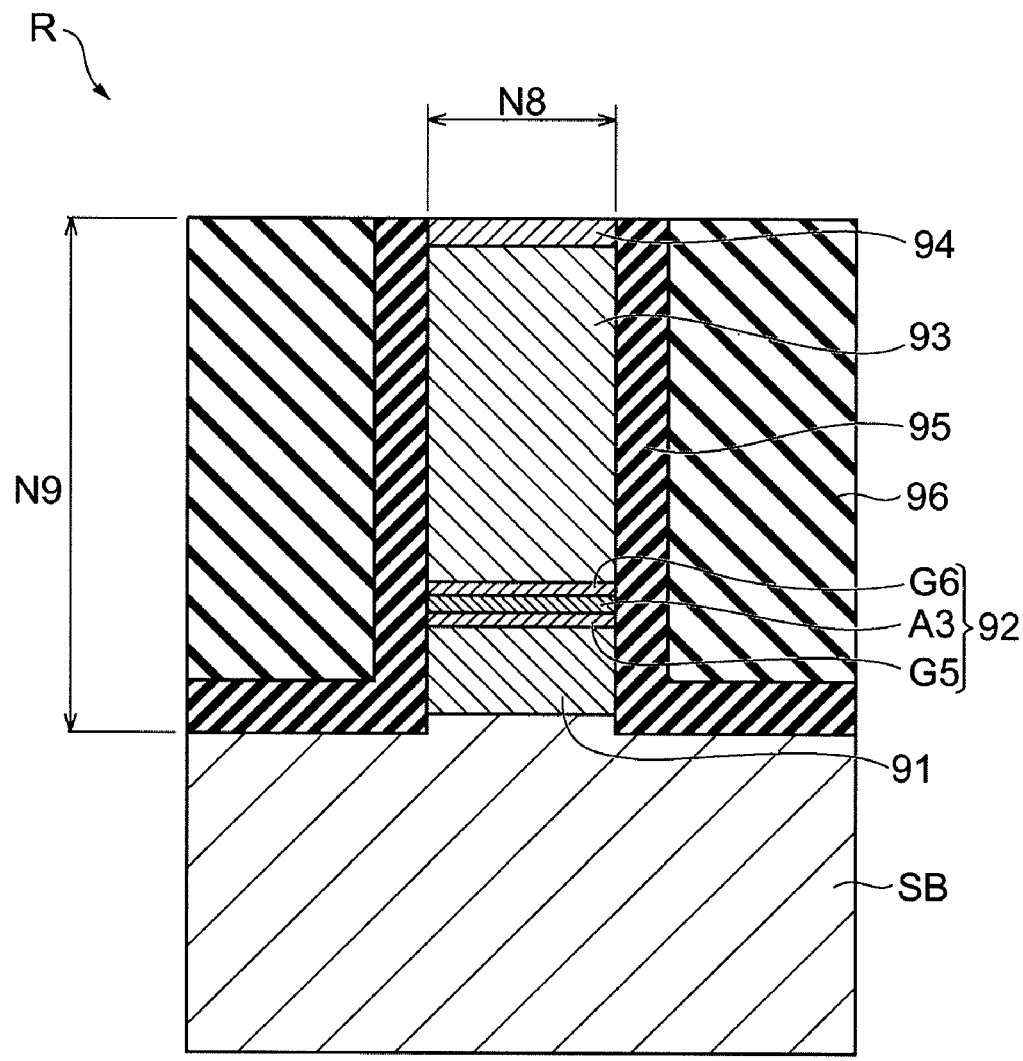
FIG. 9 is a cross-sectional view of a ring resonator taken along line IX-IX of FIG. 1.

FIG. 9 is a cross-sectional view of the ring resonator R taken along line IX-IX of FIG. 1. The upper electrode E5 and the lower electrode are omitted from FIG. 9. As illustrated in FIG. 9, the ring resonator R includes the following layers stacked on the substrate SB in the following order: a lower cladding layer 91; an optical waveguide layer 92 including a lower light guide layer G5, a tuning layer A3, and an upper light guide layer G6; an upper cladding layer 93; and a contact layer 94. The lower cladding layer 91, the optical waveguide layer 92, the upper cladding layer 93, and the contact layer 94 constitute a mesa structure. Insulating layers 95 are formed on the side of the mesa structure and a portion of the substrate SB. Polymer layers 96 are formed on the insulating layers 95.

For example, when an n-type InP substrate is used as the substrate SB, the ring resonator R may have the following structure. That is, the ring resonator R may include the following layers: the lower cladding layer 91 made of n-type InP; the optical waveguide layer 92 including the tuning layer A3 made of GaInAsP and having a bandgap wavelength of 1.4 μm, and the lower and upper light guide layers G5 and G6 that are separate confinement heterostructure (SCH) layers; the upper cladding layer 93 made of p-type InP; the contact layer 94 made of p-type GaInAs; the insulating layers 95 made of $SiO_2$; and the polymer layers 96 made of bisbenzocyclobutene (BCB).

The width N8 of the mesa structure constituted by the lower cladding layer 91, the optical waveguide layer 92, the upper cladding layer 93, and the contact layer 94 in the direction of the Y axis is, for example, 1.3 μm. The height N9 of the mesa structure in the direction of the Z axis is, for example, 4 μm.

Figure 10:
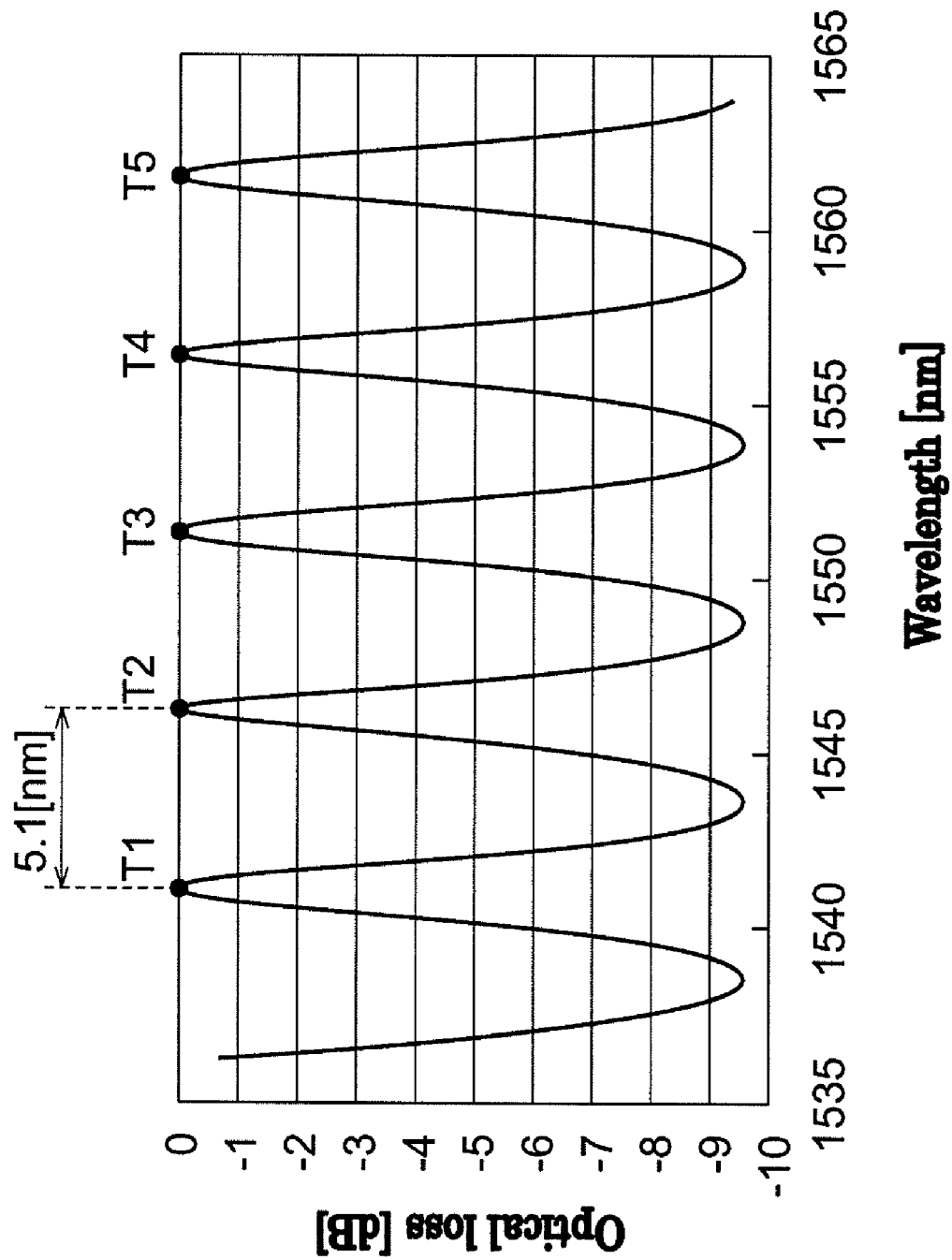
FIG. 10 is a graph showing an example of an optical transmission spectrum of the ring resonator.

The ring resonator R transmits light having specific wavelengths separated by a predetermined wavelength interval. FIG. 10 is a graph illustrating an example of the optical transmission spectrum of the ring resonator R. The horizontal axis represents the wavelength. The vertical axis represents the optical loss. The larger the negative value is, the larger the optical loss becomes. In this case, the optical transmittance has periodic peaks at wavelengths (for example, the wavelengths T1, T2, T3, T4, and T5) that are separated by a wavelength interval of 5.1 nm.

As can be seen by comparing FIG. 8 with FIG. 10, within the transmission wavelength range of any one of the ports of the optical wavelength multiplexer 5 illustrated in FIG. 8, at least one of the periodic transmission peak wavelengths of the ring resonator R illustrated in FIG. 10 exists. To be specific, within the transmission wavelength range (1545 nm to 1550 nm) of the port $P_1$ represented by the curve F1 of FIG. 8, the transmission peak wavelength T2 of the ring resonator R of FIG. 10 exists. Likewise, within the transmission wavelength range (1555 nm to 1560 nm) of the port $P_2$ represented by the curve F2 of FIG. 8, the transmission peak wavelength T4 of the ring resonator R of FIG. 10 exists. Within the transmission wavelength range (1550 nm to 1555 nm) of the port $P_3$ represented by the curve F3 of FIG. 8, the transmission peak wavelength T3 of the ring resonator R of FIG. 10 exists. Within the transmission wavelength ranges (1540 nm to 1545 nm and 1560 nm to 1565 nm) of the port $P_4$ represented by the curve F4 of FIG. 8, the transmission peak wavelengths T1 and T5 of the ring resonator R of FIG. 10 exists.

When, in this manner, at least one periodic transmission peak of the ring resonator R illustrated in FIG. 10 exists within the transmission wavelength range of any one of the ports $P_1$ to $P_4$ of the optical wavelength multiplexer 5 illustrated in FIG. 8, laser oscillation can be obtained at a predetermined wavelength. For example, when only one of the periodic transmission peak wavelengths of the ring resonator exists within the transmission wavelength range of any one of the ports $P_1$ to $P_4$ of the optical wavelength multiplexer 5, the optical reflector 7 reflects light having a specific wavelength that has passed through the ring resonator, so that laser oscillation can be obtained at the specific wavelength.

Figure 11:
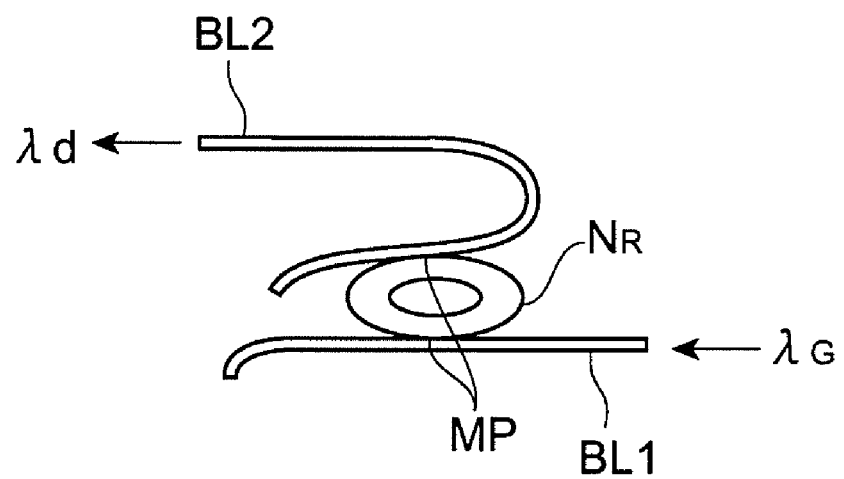
FIG. 11 illustrates a ring resonator R of FIG. 1 and the parameters thereof.

FIG. 11 illustrates a specific structure of the ring resonator R. The splitting ratio MP of the multimode interference (MMI) coupler is 1:1. The circumference length $N_R$ of the ring waveguide RG is, for example, 132.55 μm.

Figure 12:
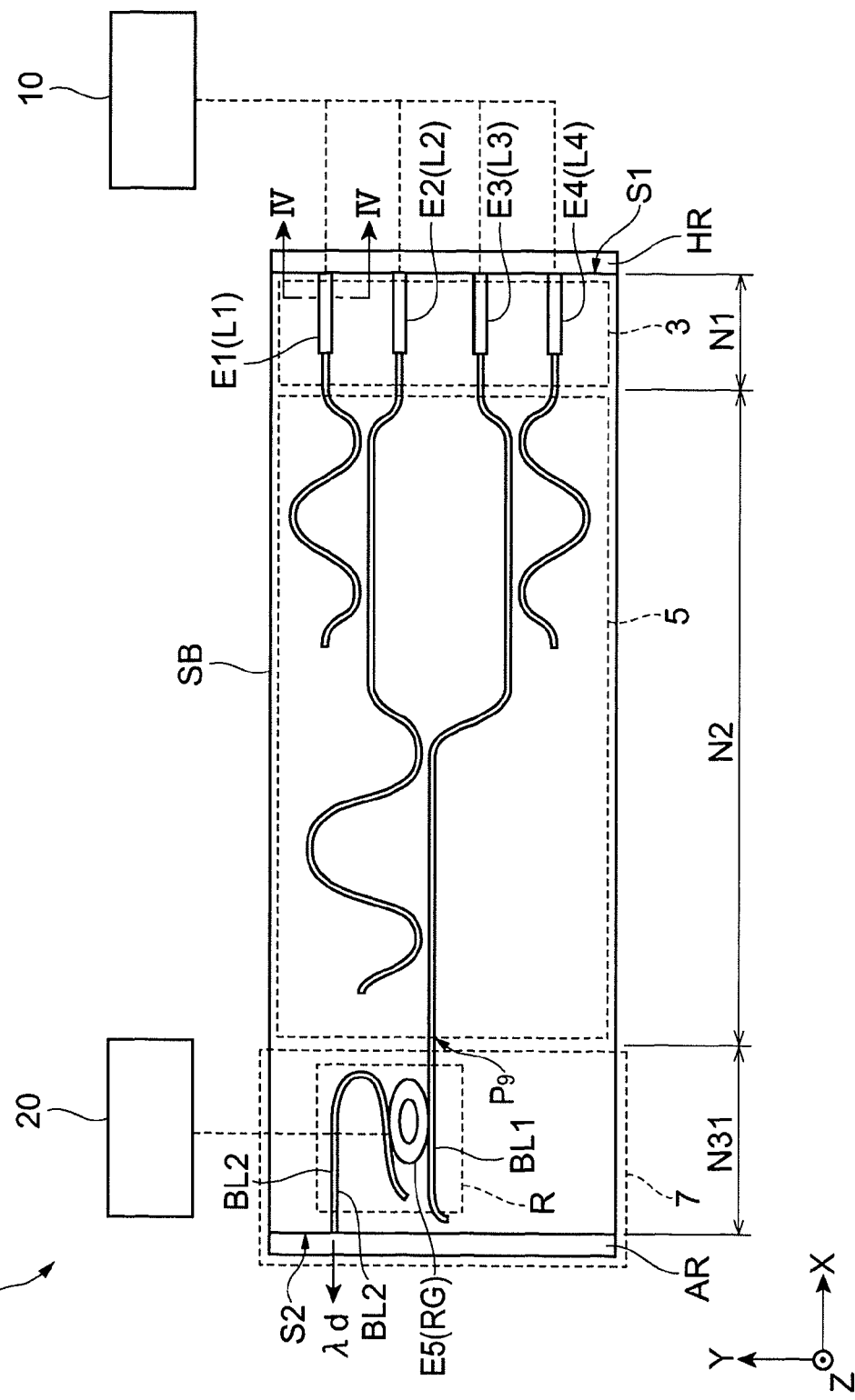
FIG. 12 is a schematic view showing the wavelength tunable laser according to the first embodiment.

In FIG. 1, a cleaved facet is used as the second facet S2. However, as illustrated in FIG. 12, the second facet S2 may further include a reflection coating film AR formed on the cleaved facet. In this case, the reflectivity of the second facet S2 can be adjusted so as to emit a laser beam with high efficiency and high power. As the reflection coating film of the second facet S2, a single-layer dielectric film or a multilayer dielectric film can be used. Examples of the film that can be formed on the second facet S2 include a low reflection coating film. The reflectivity of the low reflection coating film is, for example, in the range of 1% to 30%. As the material of the low reflection coating film, silicon nitride, for example, can be used.

A method of manufacturing the wavelength tunable laser according to the first embodiment will be described below. First, semiconductor layers to become the lower cladding layers and the optical waveguide layers of the optical wavelength multiplexer 5 and the ring resonator R of the optical reflector 7 are deposited on the substrate SB by metal-organic vapor phase epitaxy (MOVPE) method. Subsequently, a protective mask is formed on a portion to become the optical wavelength multiplexer 5 and the ring resonator R, and only a portion to become the gain region 3 is etched. As the protective mask, a dielectric film made of $SiO_2$ or SiN can be used. Next, the lower cladding layer and the optical waveguide layer of the gain region 3 are grown so that the optical wavelength multiplexer 5 and the gain region 3 are butt joint coupled. Subsequently, the protective mask is removed, and semiconductor films to become the upper cladding layers and the contact layers of the optical wavelength multiplexer 5, the ring resonator R, and the gain region 3 are deposited. Because a portion of the ring resonator can be made of semiconductor layers that are the same as the semiconductor layers of the optical wavelength multiplexer, the wavelength tunable laser can be easily manufactured by the same semiconductor process.

Next, portions of the contact layers excluding portions on which upper electrodes are to be formed in the later process (portions corresponding to the mesa structures of the gain region 3 and the ring resonator R) are removed. Protective masks are formed on the portions to become the optical wavelength multiplexer 5 and the ring resonator R, and the mesa structure of the gain region 3 is formed by dry etching. The current blocking layer is grown on the side of the mesa structure and the substrate SB by MOVPE so as to cover the mesa structure. Subsequently, the protective masks formed on the portions to become the optical wavelength multiplexer 5 and the ring resonator R are removed. Next, a protective mask is formed on the gain region 3, and the mesa structure of the optical wavelength multiplexer 5 and the ring resonator R are formed by dry etching. The protective mask formed on the gain region 3 is removed. Next, the insulating layer is deposited, and a polymer layer is applied and cured. Subsequently, the insulating layers and the polymer layers on the portions to become the upper electrodes are removed by dry etching. On the contact layers of the gain region 3 and the ring resonator R, the upper electrodes (ohmic electrodes) are formed by an evaporation method. The back surface of the substrate SB is lapped until the thickness of the substrate becomes about 100 μm, and the lower electrodes (ohmic electrodes) are formed on the back surface.

Subsequently, the substrate SB is split into bars, and a first facet of each bar is coated with the high reflection coating film HR. The bar is cut into chips to obtain a wavelength tunable laser. A wavelength tunable laser is mounted on a submount by using solder. Wire bonding is performed on the first and second groups of upper electrodes of the gain region 3 and the ring resonator R. Finally, the submount is mounted on a thermo-electric device such as a Peltier device.

Operation of the wavelength tunable laser according to the first embodiment will be described below. A case of outputting a laser beam having a wavelength of 1547 nm will be described by using specific values. By appropriately adjusting the values, a laser beam having a different wavelength can be output in a similar manner.

First, a current (for example, 150 mA) is injected into only the light emitting device L1 of the gain region 3 by a control signal from the gain control circuit 10. A current is not injected into the light emitting devices L2 to L4. A current (for example, 1.16 mA) is injected into the ring resonator R of the optical reflector 7 by a control signal from the wavelength control circuit 20. Peak wavelengths of the transmission spectrum of the ring resonator R can have predetermined values. For example, as illustrated in FIG. 10, the peak wavelengths of the transmission spectrum of the ring resonator R can be 1547.02 nm (T2), 1552.10 nm (T3), and 1557.26 nm (T4).

When light emitted from the light emitting device L1 of the gain region 3 and having a predetermined wavelength range passes through the port $P_1$ toward the port $P_9$ of the optical wavelength multiplexer 5, an optical loss represented by the curve F1 of FIG. 8 occurs as a function of the wavelength of the light. The optical reflector 7 and the first facet S1 having the high reflection coating film form a laser cavity. The laser cavity has the lowest loss at a wavelength that is within a transmission wavelength range (for example, 1545 nm to 1550 nm) of the optical wavelength multiplexer 5 and that is one of the peak wavelengths (for example, 1547.02 nm) of the transmission spectrum of the ring resonator R. Thus, laser oscillation occurs at the wavelength (for example, 1547.02 nm) at which the laser cavity has the lowest loss.

Figure 13:
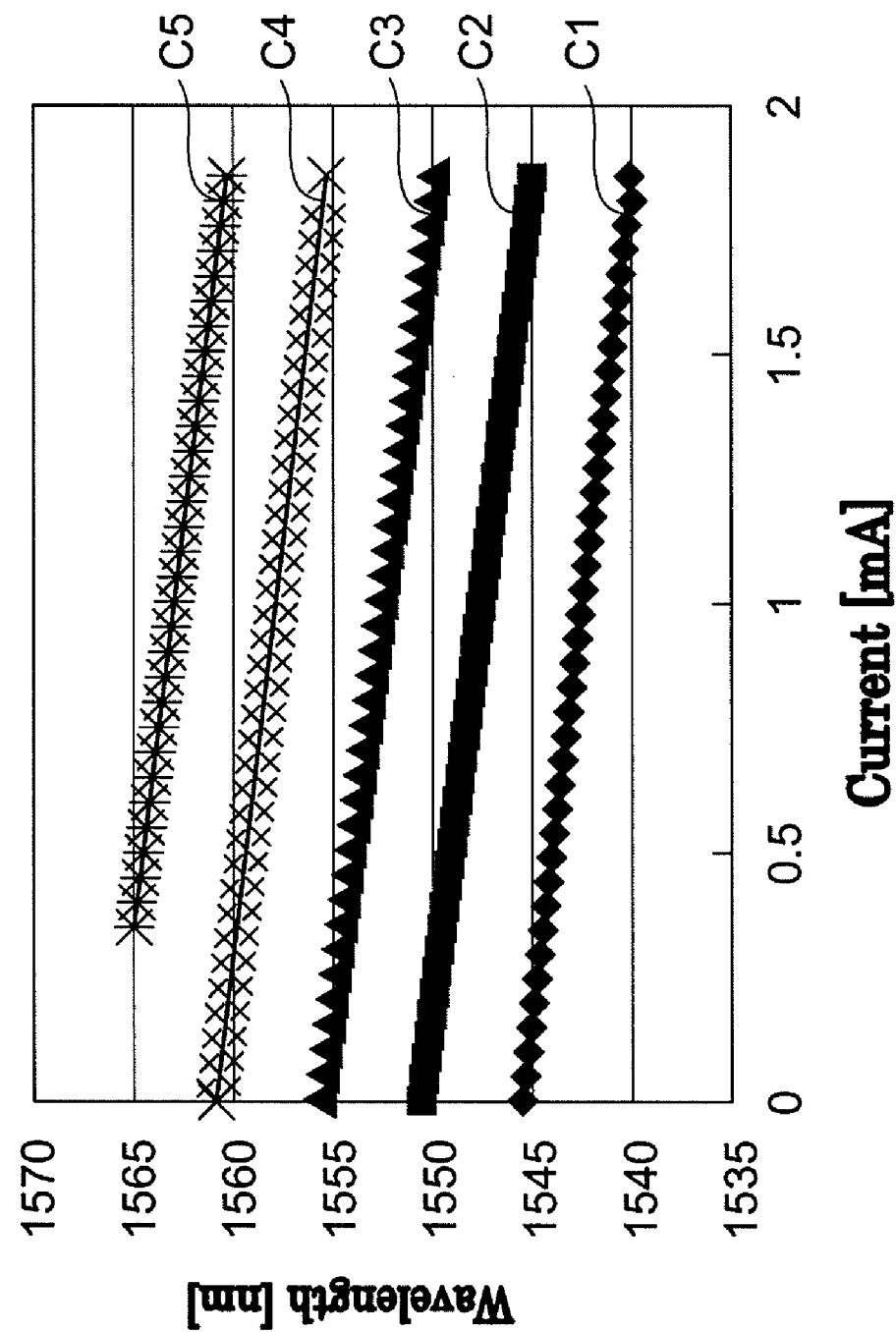
FIG. 13 is a graph showing the peak wavelength shift of the reflection spectrum of an optical reflector.

FIG. 13 is a graph illustrating the peak wavelength shift of the transmission spectrum of the ring resonator R, that is, the peak wavelength shift of the reflection spectrum of the optical reflector 7, when the amount of current injected into the ring resonator R of the optical reflector 7 is changed. When the current injected into ring resonator R is adjusted in the range of 0 mA to 1.85 mA, one of the peaks of the transmission spectrum of the ring resonator R illustrated in FIG. 10 exists in the wavelength range of 1540 nm to 1560 nm. That is, by adjusting the amount of current injected into the ring resonator R of the optical reflector 7, the wavelength can be changed. Thus, the oscillation wavelength of the laser can be tuned within a desired wavelength range.

As described above, in the wavelength tunable laser according to the first embodiment, light is generated by performing on-off control of current injection into the gain region, and then light is combined by the optical wavelength multiplexer. The light through the optical wavelength multiplexer has a predetermined wavelength band. The light is reflected by the optical reflector which has the reflection spectrum with the periodic reflection peaks. The optical reflector and the first facet including the high reflection coating film form a laser cavity. The laser light having a single wavelength is emitted from the optical reflector. The lasing wavelength is easily tuning by control of the current injected into the ring resonator R of the optical reflector 7. As a result, the wavelength tunable laser facilitates simple current control. Moreover, the optical wavelength multiplexer serves to separate a segment, and the high reflection coating film serves to perform feedback of light in the laser cavity.

The wavelength dependence of the high reflection coating film is relatively low within the transmission wavelength band limited by the optical wavelength multiplexer. Furthermore, the transmittance of the wavelength multiplexer changes smoothly depending on wavelength. Consequently, tuning characteristics of the wavelength tunable laser substantially depends on the reflection wavelengths of the optical reflector which can be changed by injecting a current into the optical reflector.

Second Embodiment

Figure 14:
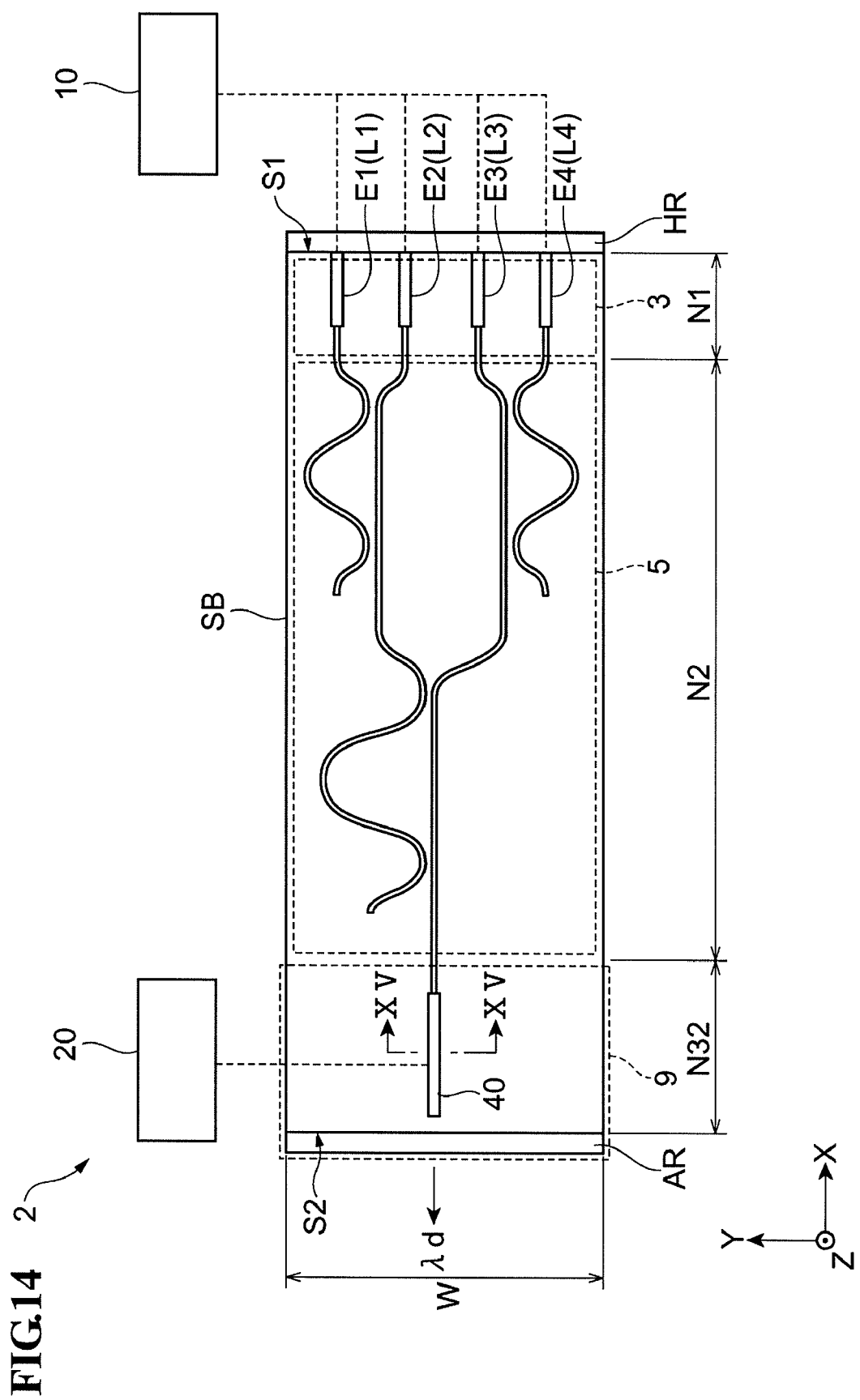
FIG. 14 is a schematic view showing a wavelength tunable laser according to a second embodiment.
Figure 15:
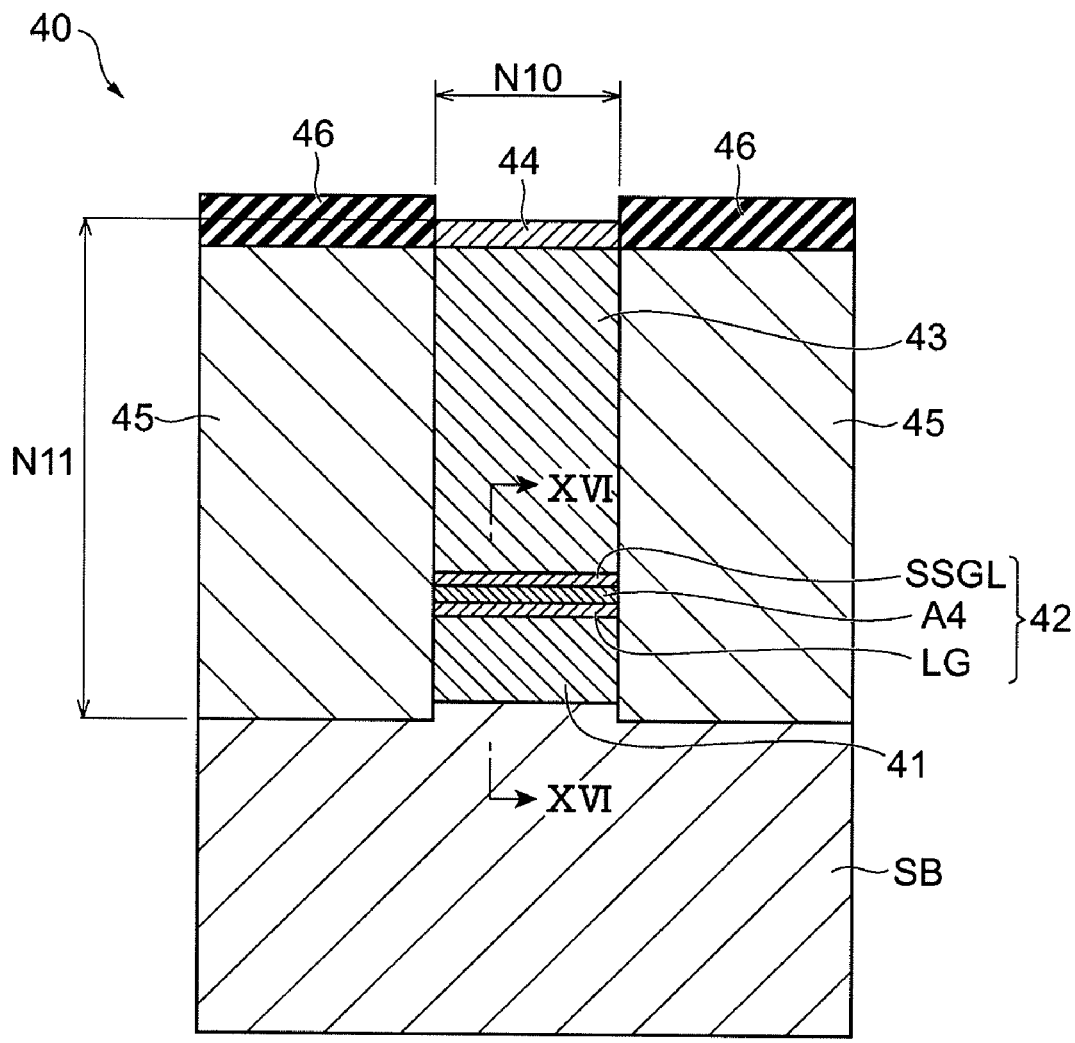
FIG. 15 is a cross-sectional view of an optical device 40 taken along line XV-XV of FIG. 14.
Figure 16:
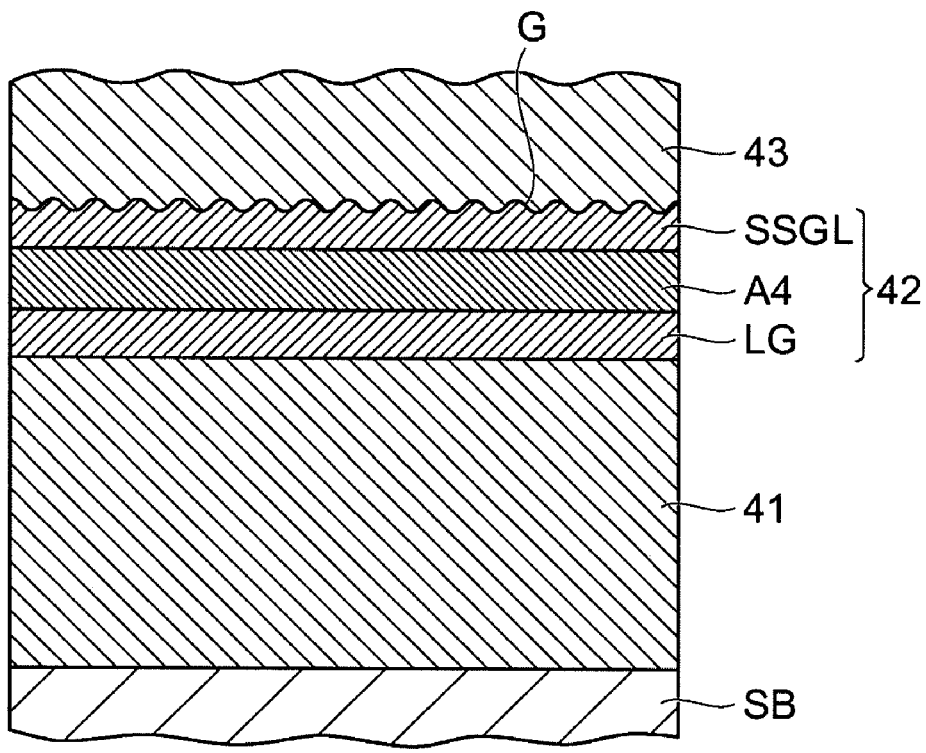
FIG. 16 is a cross-sectional view of the optical device 40 taken along line XVI-XVI of FIG. 15, or taken along the direction of the optical axis (X axis)
Figure 16:
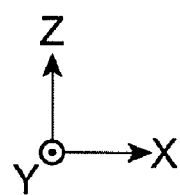

Hereinafter, a wavelength tunable laser according to a second embodiment will be described. FIG. 14 is a conceptual diagram of the wavelength tunable laser according to the second embodiment. FIG. 15 is a cross-sectional view of an optical device 40 taken along line XV-XV of FIG. 14. FIG. 16 is a sectional view of the optical device 40 taken along line XVI-XVI of FIG. 15, or taken along the direction of the optical axis (X axis).

A wavelength tunable laser 2 illustrated in FIG. 14 differs from the wavelength tunable laser 1 according to the first embodiment in that the wavelength tunable laser 2 includes an optical reflector 9 instead of the optical reflector 7 having the reflection spectrum with the periodic reflection peaks. The structure of the optical reflector 9 will be described below. As illustrated in FIG. 14, in the wavelength tunable laser 2 according to the second embodiment, the optical reflector 9 is disposed adjacent to a second facet S2. The optical reflector 9 includes the optical device 40 including super structure grating (SSG) and a low reflection coating film AR coated on the second facet S2. The super structure grating (SSG) has periodic reflection peaks. The low reflection coating film AR has a reflectivity lower than 0.2% in the wavelength range of 1540 nm to 1560 nm.

As illustrated in FIG. 14, the optical reflector 9 has a length N32 in the direction of the optical axis (X axis) of the wavelength tunable laser 2. The length N32 is, for example, 600 µm. That is, the length of the wavelength tunable laser 2 in the direction of the X axis can be, for example, 1750 µm, which is 400 µm longer than the length of the wavelength tunable laser 1 according to the first embodiment.

As illustrated in FIGS. 15 and 16, the optical device 40 of the optical reflector 9 includes the following layers stacked on a substrate SB in the following order: a lower cladding layer 41; an optical waveguide layer 42 including a lower light guide layer LG, a tuning layer A4, and a super structure grating layer SSGL; an upper cladding layer 43; and a contact layer 44. The lower cladding layer 41, the optical waveguide layer 42, the upper cladding layer 43, and the contact layer 44 constitute a mesa structure. Current blocking layers 45 are formed so as to cover the sides of the mesa structure and a portion of the substrate SB. Insulating layers 46 are formed on the current blocking layers 45.

When an n-type InP substrate is used as the substrate SB, the optical device 40 of the optical reflector 9 may have the following structure. That is, the optical device 40 may include the following layers: the lower cladding layer 41 made of n-type InP; the optical waveguide layer 42 including the tuning layer A4 made of GaInAsP and having a bandgap wavelength of 1.4 µm, the lower light guide layer LG; and the super structure grating layer SSGL made of GaInAsP and having a bandgap wavelength of 1.2 µm; the upper cladding layer 43 made of p-type InP; the contact layer 44 made of p-type GaInAs; the current blocking layers made of Fe—InP; and the insulating layers 46 made of $SiO_2$.

The width N10 of the mesa structure in the direction of the Y axis is, for example, 1.8 µm. The height N11 of the mesa structure in the direction of the Z axis is, for example, 4 µm.

Figure 17:
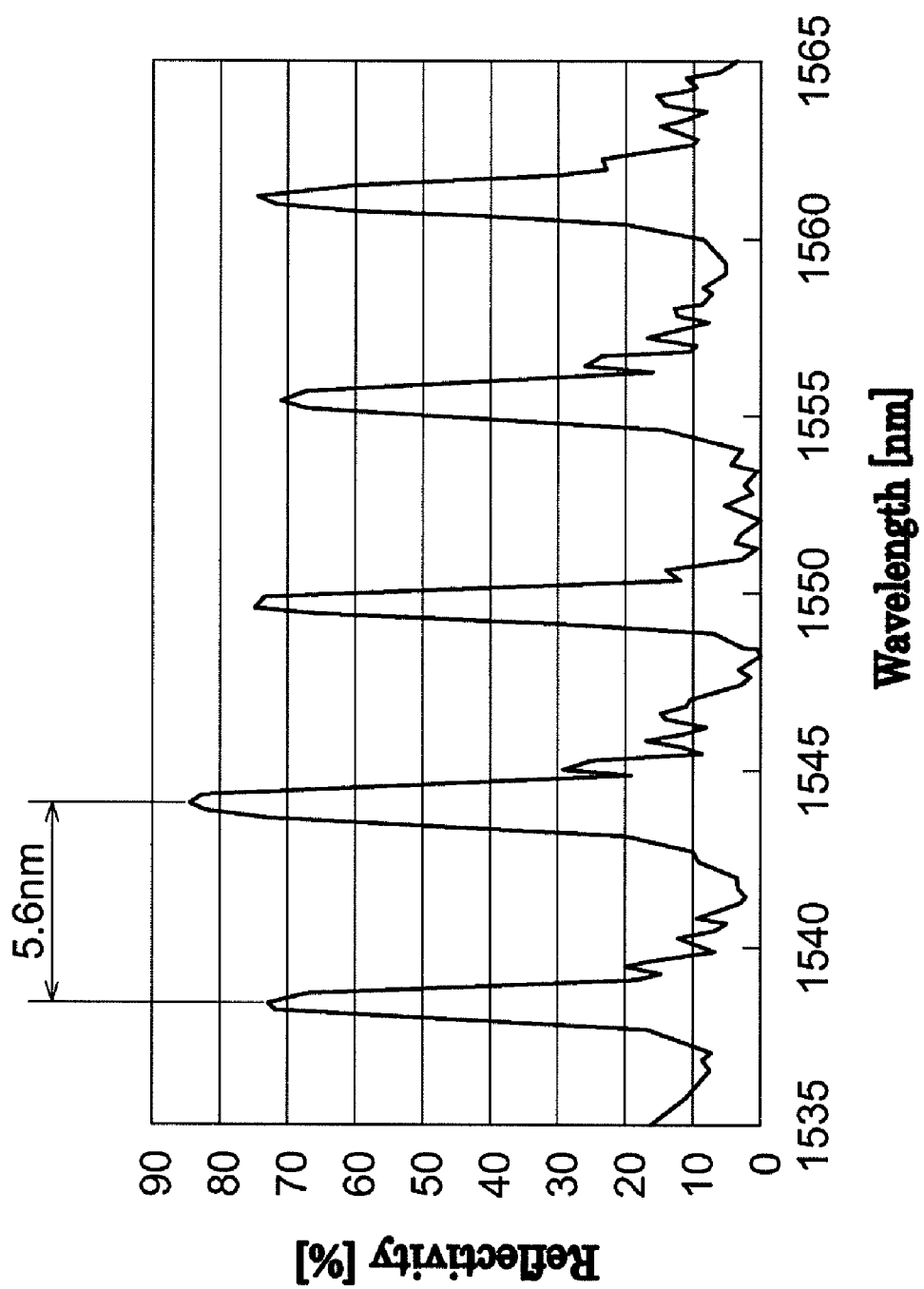
FIG. 17 is a graph showing the reflection spectrum of an optical device including a super structure grating.

The super structure grating layer SSGL includes a diffraction grating G having a periodic projections and recesses extending in the direction of the optical axis of the wavelength tunable laser (the direction of the X axis). The super structure grating layer SSGL and the upper cladding layer 43 constitute the super structure grating structure(SSG). The reflection spectrum of the optical device 40 including the super structure grating structure has periodic reflection peaks. FIG. 17 illustrates an example of the reflection spectrum of the optical device 40. The reflection spectrum illustrated in FIG. 17 has five periodic reflectivity peaks separated by a wavelength interval of 5.6 nm in the wavelength range of 1535 nm to 1565 nm.

Although not illustrated, a wavelength control circuit 20 is connected to the second group of upper electrodes formed on the contact layer 44 and to lower electrodes disposed on the lower surface of the substrate SB. The wavelength control circuit can control the amount of current injected into the optical device 40 so as to change the reflection wavelength of the optical reflector 9.

In the optical wavelength multiplexer of the second embodiment, by controlling the difference in the lengths of the arms of the optical wavelength multiplexer in the same manner as the first embodiment, the transmission wavelength band of the optical wavelength multiplexer is adjusted to the wavelength interval in reflection spectrum of the super structure grating structure (for example, 5.6 nm interval).

A method of manufacturing the wavelength tunable laser according to the second embodiment will be described below. First, the lower cladding layer and the optical waveguide layer including the lower light guide layer LG; the tuning layer, and the super structure grating layer SSGL are grown on the entire surface of the substrate SB. Next, the diffraction grating G to form the super structure grating structure (SSG) is formed on the super structure grating layer SSGL by electron beam lithography method and dry etching process. Protective masks are formed on the optical device 40 and the optical wavelength multiplexer 5, and only a portion to become the gain region 3 is etched. Subsequently, the lower cladding layer and the optical waveguide layer of the gain region 3 are grown so that the gain region 3 and the optical wavelength multiplexer 5 are butt joint coupled. The protective masks are removed, and the upper cladding layer and the contact layer are formed. A portion of the contact layer excluding the mesa structures of the gain region 3 and the optical device 40 is removed. A protective mask is formed on a portion to become the optical wavelength multiplexer 5, and the mesa structures of the optical device 40 and the gain region 3 are formed by dry etching process. The current blocking layers are grown by MOVPE so as to cover the mesa structures. The protective mask formed on a portion to become the optical wavelength multiplexer 5 is removed.

Protective masks are formed on the optical device 40 and the gain region 3, and the mesa structure of the optical wavelength multiplexer 5 is formed by dry etching process. The masks are removed, and the insulating layer and the polymer layer are formed. Portions of the insulating layer and the polymer layer on which the upper electrodes are to be formed are removed by dry etching process. The upper electrodes (ohmic electrodes) are formed by evaporation process. The back surface of the substrate SB is lapped, and the lower electrode (ohmic electrode) is formed. Subsequently, the substrate SB is split into bars, and a first facet of each bar is coated with the high reflection coating film HR. A second facet of each bar is coated with the low reflection coating film AR. The bar is cut into chips to obtain a wavelength tunable laser. The wavelength tunable laser is mounted on a submount. Wire bonding is performed on the upper electrodes. Finally, the submount on which the wavelength tunable laser is mounted is mounted on a thermo-electric device such as a Peltier device.

Operation of the wavelength tunable laser according to the second embodiment will be described below. A case of outputting a laser beam having a wavelength of 1554.2 nm will be described by using specific values. By appropriately adjusting the values, a laser beam having a different wavelength can be output in a similar manner.

First, a current is injected into only one of the two or more light emitting devices of the gain region 3 by a control signal from the gain control circuit 10. The light emitting devices of the gain region 3 are arranged parallel to one another. A current (for example, 150 mA) is injected into only the light emitting device L3 of the gain region 3, for example, and a current is not injected into the light emitting devices L1, L2, and L4. A current (for example, 2.0 mA) is injected into the optical device 40 including the super structure grating SSG by a control signal from the wavelength control circuit 20.

When light emitted from the light emitting device L3 passes through the optical wavelength multiplexer 5, the optical loss represented by the curve F3 of FIG. 8 occurs as a function of the wavelength of the light. When the current has the above-described value, only one of the reflection peak wavelengths (1554.2 nm) of the reflection spectrum the optical device 40 exists within one of the transmission wavelength ranges (1550 nm to 1555 nm) of the corresponding port $P_3$ of the optical wavelength multiplexer 5, as illustrated in FIG. 17.

The super structure grating SSG of the optical device 40 and the first facet S1 with the high reflection coating film HR form a laser cavity. Laser oscillation occurs at a wavelength (for example, 1554.2 nm) that is within a transmission wavelength range (for example, 1550 nm to 1555 nm) of the corresponding port $P_3$ of the optical wavelength multiplexer and that is the reflection peak wavelength (for example, 1554.2 nm) of the reflectivity of the super structure grating SSG.

Likewise, when a current is injected into one of the other light emitting devices (L1, L2, or L4) of the gain region 3, one of the reflection peaks of the optical device 40 of the optical reflector 9 exists in the transmission wavelength ranges of a corresponding port of the optical wavelength multiplexer 5.

Figure 18:
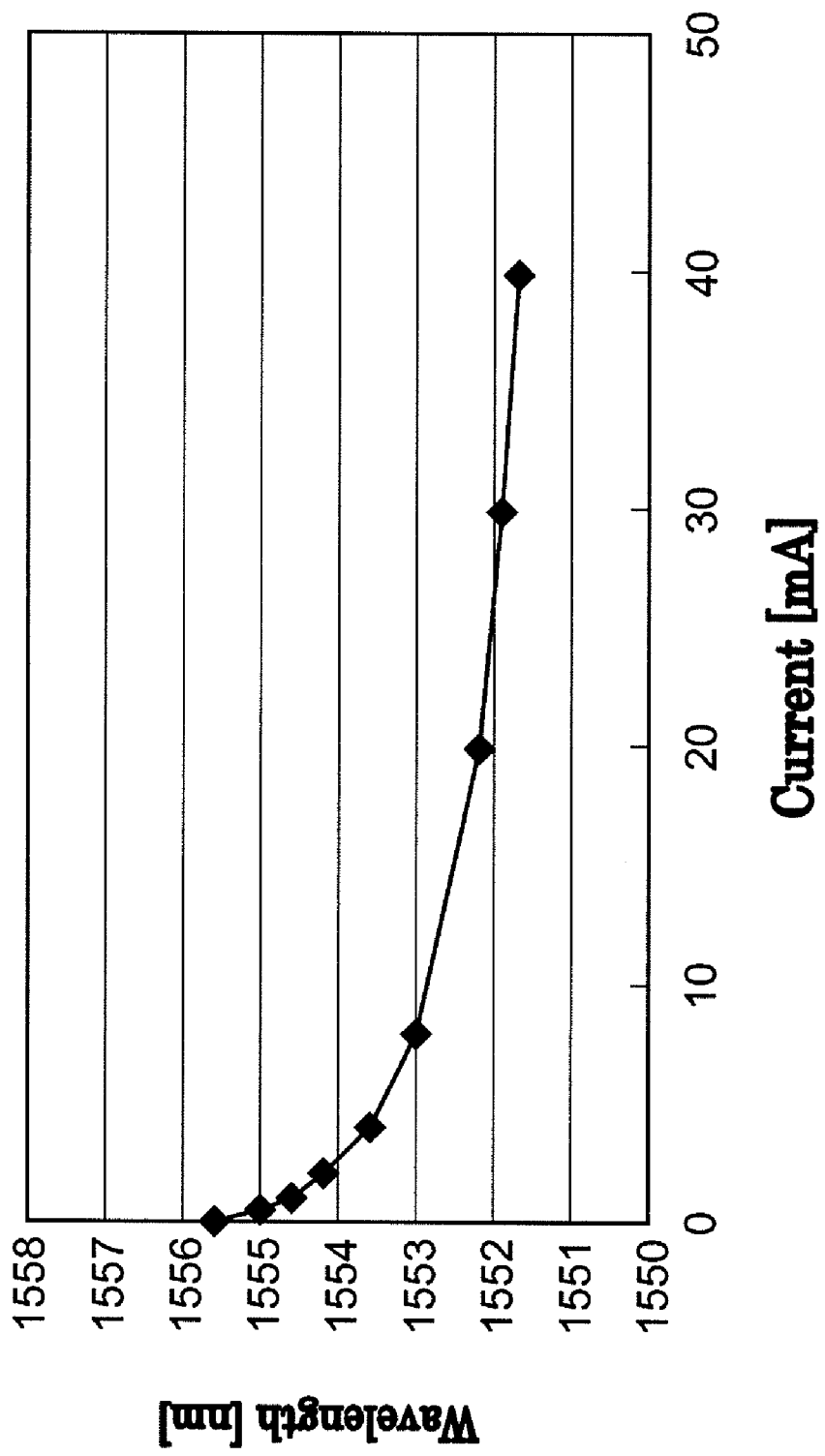
FIG. 18 is a graph showing the peak wavelength shift of the reflection spectrum of the optical device including the super structure grating.

FIG. 18 illustrates the peak wavelength shift of the reflection spectrum of the optical device 40 including the super structure grating SSG when a current injected into the optical device 40 is changed. In this case, a current is injected into the light emitting device L3 of the gain region 3. As can be seen from FIG. 18, by changing the amount of current injected into the optical device 40 (for example, in the range of 0 mA to 40 mA), the reflection wavelength can be changed (for example, within a range of about 4 nm).

As described above, the second embodiment has advantages similar to those of the wavelength tunable laser 1 of the first embodiment. Since the optical device 40 includes the super structure grating SSG having a periodic reflection spectrum, the optical device 40 is suitable for an optical reflector for reflecting light having a specific wavelength among the light that has been combined by the optical wavelength multiplexer 5. By adjusting the amount of current injected into the optical device 40 including the super structure grating SSG the laser oscillation wavelength can be tuned.

Heretofore, preferred embodiments of the present invention have been described in detail. However, the present invention is not limited to the embodiments. In the embodiments, a wavelength tunable laser includes four light emitting devices in the gain region. It is preferable that the number of the light emitting devices in the gain region be in the range of two to eight. In the embodiments, the transmission wavelength range of the optical wavelength multiplexer is 5 nm. It is preferable that the transmission wavelength range of the optical wavelength multiplexer be in the range of 2 nm to 7 nm. In the embodiments, the semiconductor layers of the wavelength tunable laser are stacked on a n-type substrate. However, the semiconductor layers of the wavelength tunable laser may be stacked on a p-type substrate.

In the embodiments, an optical gain is generated by injecting a current into only one of the two or more light emitting devices of the gain region 3, which are arranged parallel to one another. However, currents may be injected into two or more light emitting devices of the gain region 3 so as to generate an optical gain. For example, by simultaneously injecting currents into the light emitting devices L1 to L4 of the gain region 3, laser beams having four specific wavelengths can be simultaneously emitted. In any of the cases, advantages similar to those of the embodiments can be obtained.

The principle of the present invention has been illustrated and described using the preferred embodiments. However, it should be understood by those skilled in the art that the present invention may be modified without departing from the principle with respect to dispositions and details. The present invention is not limited to specific structures of the embodiments. Therefore, the following claims encompass all modifications and variations within the spirit and scope of the present invention.

What is claimed is:

1. A wavelength tunable laser comprising:
    a first facet including a high reflection coating film;
    a gain region disposed adjacent to the first facet, the gain region including two or more light emitting devices that are arranged parallel to one another;
    an optical wavelength multiplexer optically connected to the light emitting devices; and
    an optical reflector disposed adjacent to a second facet opposite the first facet, the optical reflector having a reflection spectrum with periodic reflection peaks,
    wherein the optical wavelength multiplexer is disposed between the gain region and the optical reflector, and
    wherein the optical reflector and the first facet including the high reflection coating film form a laser cavity.

2. The wavelength tunable laser according to claim 1, wherein the optical reflector having the reflection spectrum with the periodic reflection peaks includes a ring resonator and the second facet.

3. The wavelength tunable laser according to claim 2, wherein the second facet has an anti-reflective coating thereon.

4. The wavelength tunable laser according to claim 2, wherein the second facet is a cleaved facet.

5. The wavelength tunable laser according to claim 1, wherein the optical wavelength multiplexer includes a Mach-Zehnder interferometer.

6. The wavelength tunable laser according to claim 1, wherein the optical wavelength multiplexer includes first and second Mach-Zehnder interferometer groups connected in a cascade manner.

7. The wavelength tunable laser according to claim 1, wherein the gain region, the optical wavelength multiplexer, and the optical reflector are formed on a single semiconductor substrate, and
    wherein the optical wavelength multiplexer and the gain region are optically coupled to each other by butt joint coupling.

8. The wavelength tunable laser according to claim 1, wherein the optical wavelength multiplexer has a transmission wavelength range narrower than a emission wavelength range of the light from the light emitting device.

9. The wavelength tunable laser according to claim 1, wherein at least one of the periodic reflection peaks in the reflection spectrum of the optical reflector exists within the transmission wavelength range of the optical wavelength multiplexer.

10. The wavelength tunable laser according to claim 1, further comprising:
    a first group of upper electrodes disposed on the light emitting device, and
    a second group of upper electrodes disposed on the optical reflector having the reflection spectrum with the periodic reflection peaks.

11. The wavelength tunable laser according to claim 1, further comprising:
    a gain control circuit electrically connected to the light emitting devices; and
    a wavelength control circuit electrically connected to the optical reflector having the reflection spectrum with the periodic reflection peaks.

* * * * *